(12) United States Patent
Terai

(10) Patent No.: US 8,767,439 B2
(45) Date of Patent: Jul. 1, 2014

(54) RESISTANCE CHANGE NONVOLATILE MEMORY DEVICE, SEMICONDUCTOR DEVICE, AND METHOD OF OPERATING RESISTANCE CHANGE NONVOLATILE MEMORY DEVICE

(75) Inventor: Masayuki Terai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 141 days.

(21) Appl. No.: 13/563,604

(22) Filed: Jul. 31, 2012

(65) Prior Publication Data

US 2013/0064002 A1   Mar. 14, 2013

(30) Foreign Application Priority Data

Sep. 14, 2011   (JP) .................................. 2011-200406

(51) Int. Cl.
*G11C 11/00* (2006.01)
*G11C 13/00* (2006.01)

(52) U.S. Cl.
CPC ........ *G11C 13/0002* (2013.01); *G11C 13/0007* (2013.01)
USPC ............................ 365/148; 365/158; 365/163

(58) Field of Classification Search
CPC ........... G11C 13/0002; G11C 13/0004; G11C 13/0007; H01L 27/10; H01L 27/105; H01L 45/00; H01L 49/00
USPC .......................... 365/148, 100, 113, 158, 163
See application file for complete search history.

(56) References Cited

U.S. PATENT DOCUMENTS

| | | | | |
|---|---|---|---|---|
| 6,809,362 B2 * | 10/2004 | Gilton | ........................... | 257/296 |
| 6,867,996 B2 * | 3/2005 | Campbell et al. | ............. | 365/100 |
| 7,764,160 B2 | 7/2010 | Kawano et al. | | |
| 8,116,116 B2 * | 2/2012 | Hwang et al. | ................. | 365/148 |
| 2008/0048164 A1 | 2/2008 | Odagawa | | |
| 2011/0002154 A1 | 1/2011 | Mitani et al. | | |

FOREIGN PATENT DOCUMENTS

| | | |
|---|---|---|
| JP | 2008-021750 A | 1/2008 |
| JP | 2009-021524 A | 1/2009 |
| JP | 2009-135370 A | 6/2009 |
| JP | 2009-212380 A | 9/2009 |
| JP | 2010-021381 A | 1/2010 |

(Continued)

OTHER PUBLICATIONS

W.W.Zhuang, et al., "Novell Colossal Magnetoresistive Thin Film Nonvolatile Resistance Random Access Memo(RRAM)", IEDM, No. 7, 5, pp. 193-196, 2002.

(Continued)

*Primary Examiner* — Tan T. Nguyen
(74) *Attorney, Agent, or Firm* — McGinn IP Law Group, PLLC

(57) ABSTRACT

A resistance change nonvolatile memory device includes with a first electrode, a resistance change portion provided on the first electrode, and a second electrode provided on the resistance change portion. The resistance change portion is equipped with a resistance change layer provided on the first electrode and undergoing a change in resistance with an applied voltage and a stable layer provided on the resistance change layer and forming a filament. The resistance change layer and the stable layer are made of metal oxides different from each other. The oxide formation energy of the resistance change layer is higher than that of the stable layer. The resistance change layer has such a film thickness as to permit the resistance of the resistance change portion in an Off state to fall within a range determined by the film thickness.

12 Claims, 26 Drawing Sheets

(56) References Cited

FOREIGN PATENT DOCUMENTS

JP         4469023 B2    5/2010
WO    WO2008/038365 A1   4/2008

OTHER PUBLICATIONS

M.Terai,et al.,"Resistance of ReRAM-Stack Asymmetry on Read Disturb Immunity", IRPS Tech.Dig., p. 134-138, 2009.

M.Terai et. al., "Resistance Controllability of $Ta_2O_5/TiO_2$ Stack ReRAM for Low-Voltage and Multilevel Operation" IEEE Electron Device letter, vol. 31, Issue. 3, pp. 204-206, 2010.

Y. Sakotsubo et al.,"Physical Model for Reset State of $Ta_2O_5/TiO_2$-Stacked Resistance Random Access Memory", JJAP, vol. 49, 04DD19, 2010.

* cited by examiner

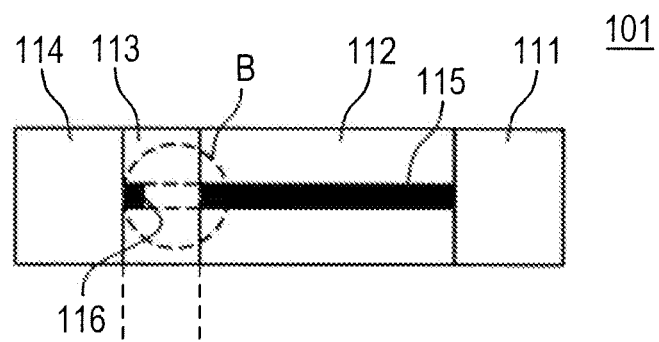
*FIG. 6A*
*FIG. 6B*
*FIG. 6C*
*FIG. 6D*
*FIG. 7*
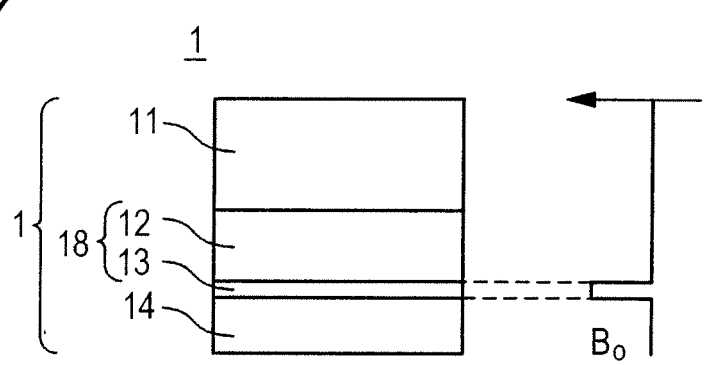

| y \ x | 0 | 1 | 2 | 3 |
|---|---|---|---|---|
| 0 | 1 | 0 | 0 | 0 |
| 1 | 0 | 1 | 0 | 0 |
| 2 | 0 | 0 | 1 | 0 |
| 3 | 0 | 0 | 0 | 1 |

| y \ x | 0 | 1 | 2 | 3 |
|---|---|---|---|---|
| 0 | 0 | 0 | 0 | 1 |
| 1 | 0 | 0 | 1 | 0 |
| 2 | 0 | 1 | 0 | 0 |
| 3 | 0 | 0 | 0 | 0 |

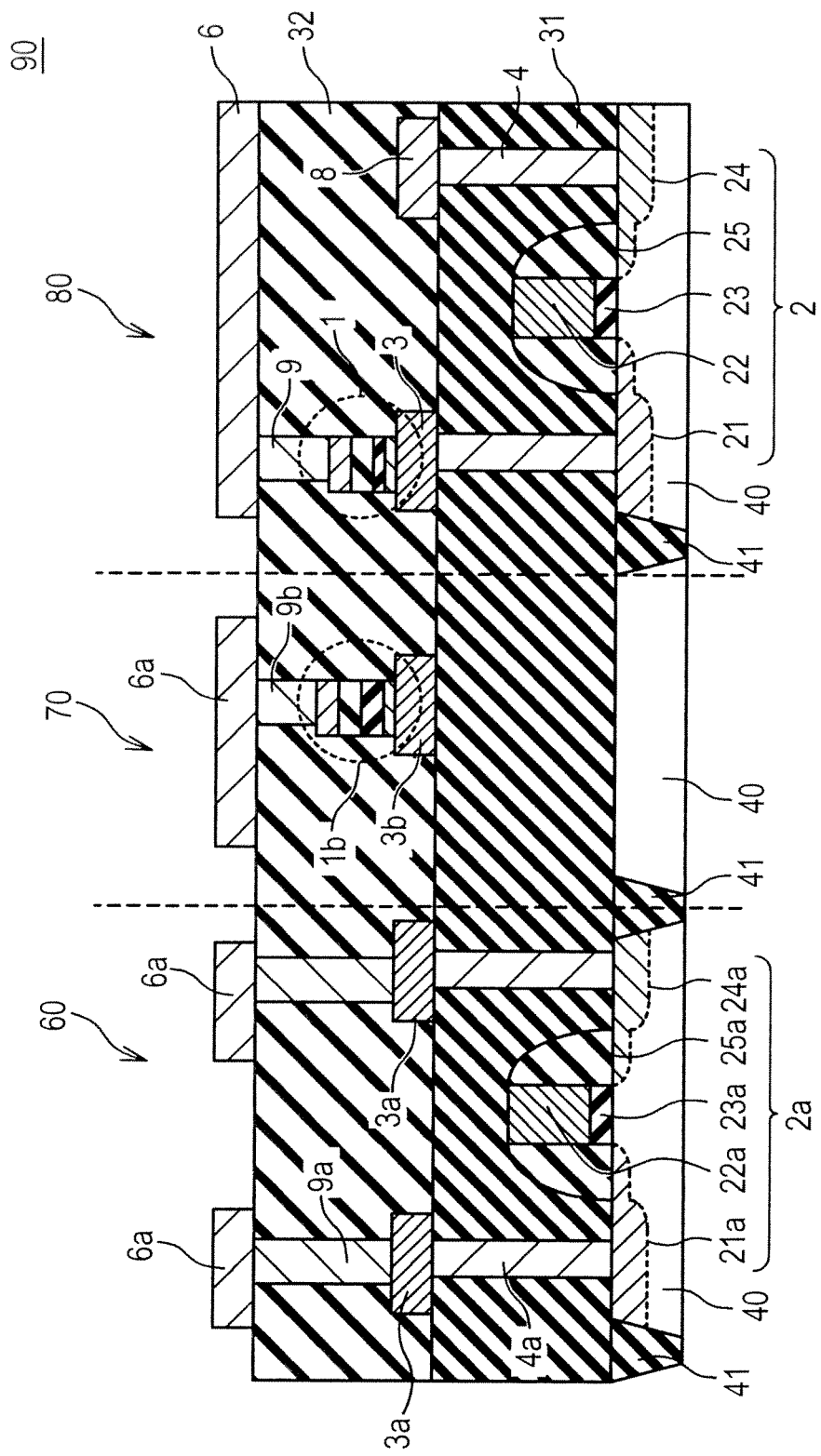

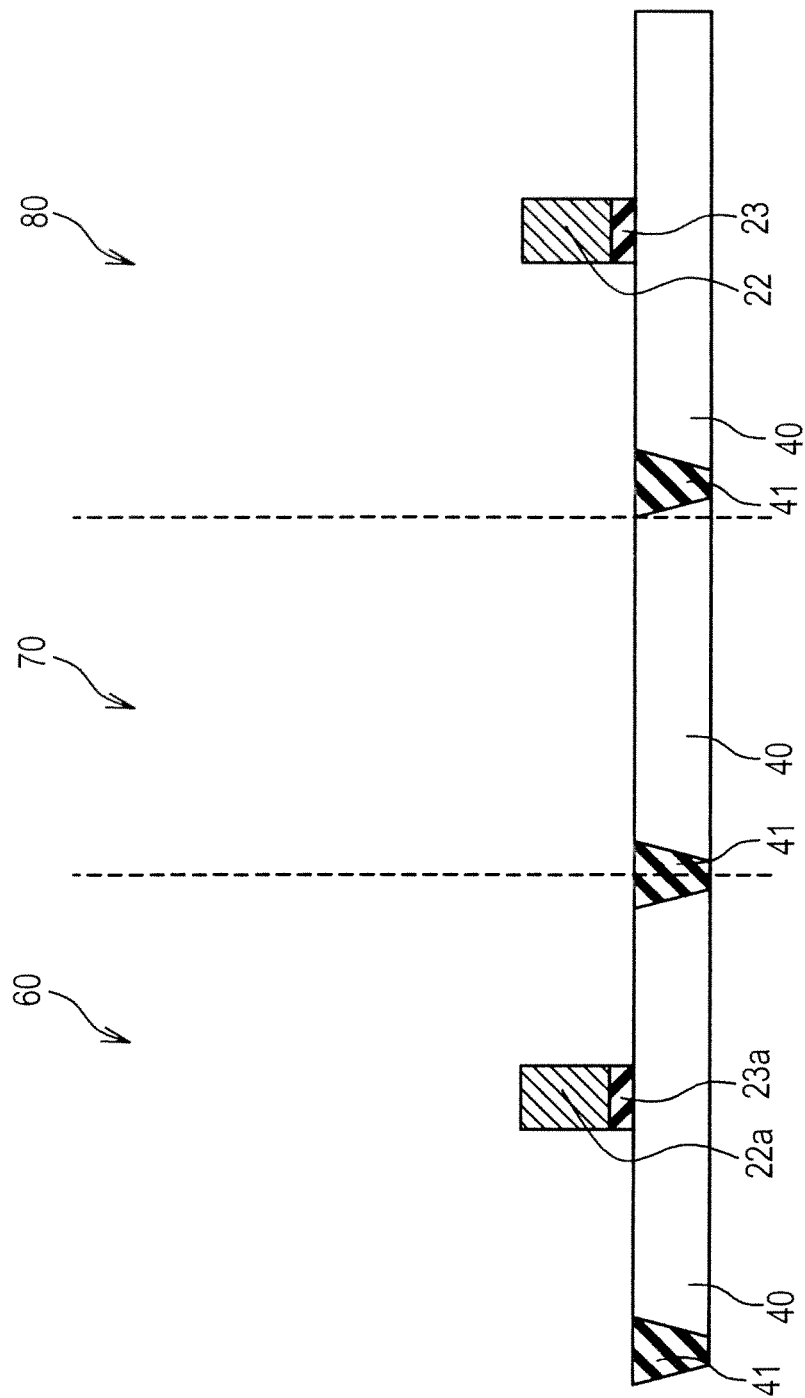

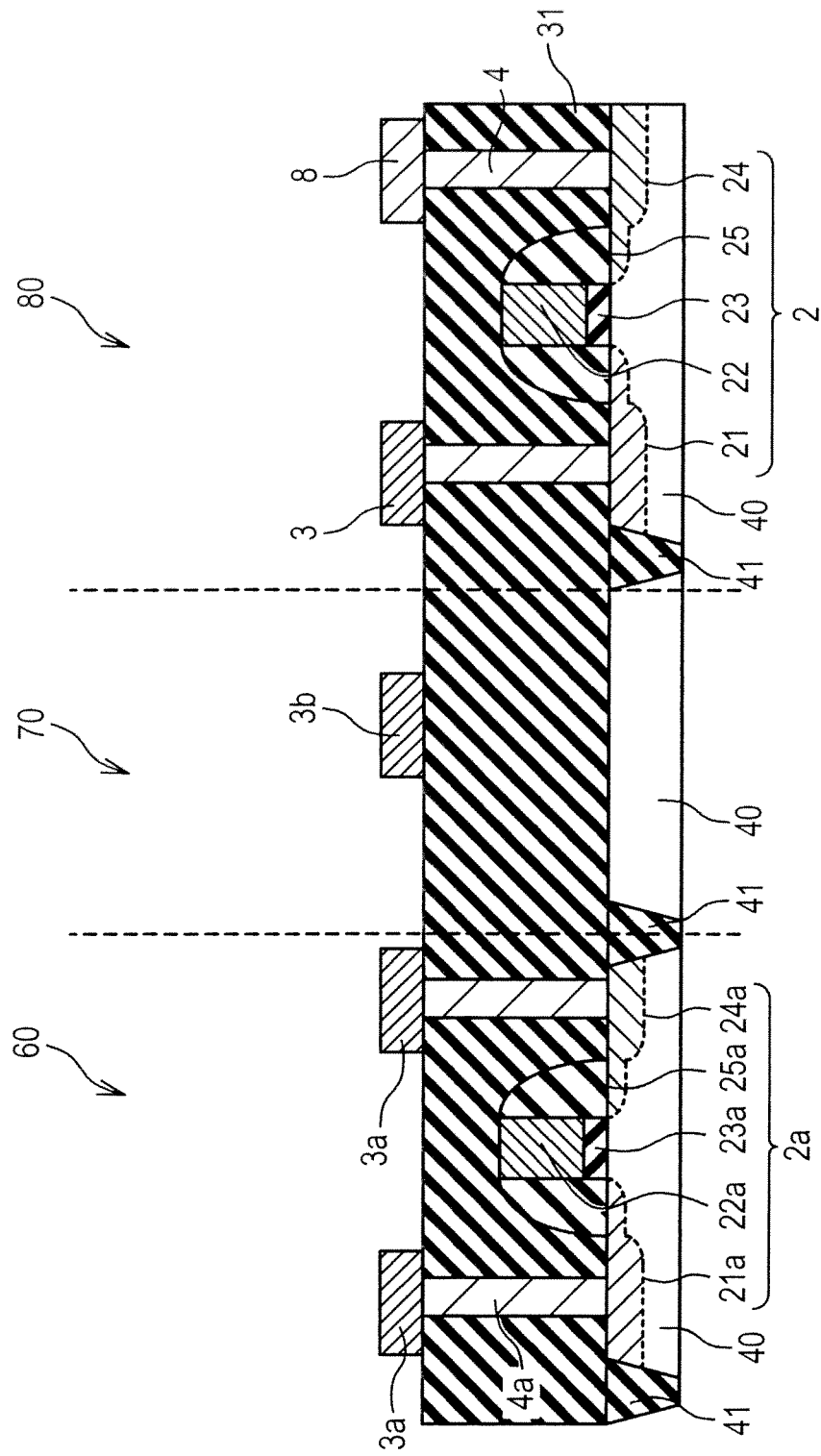

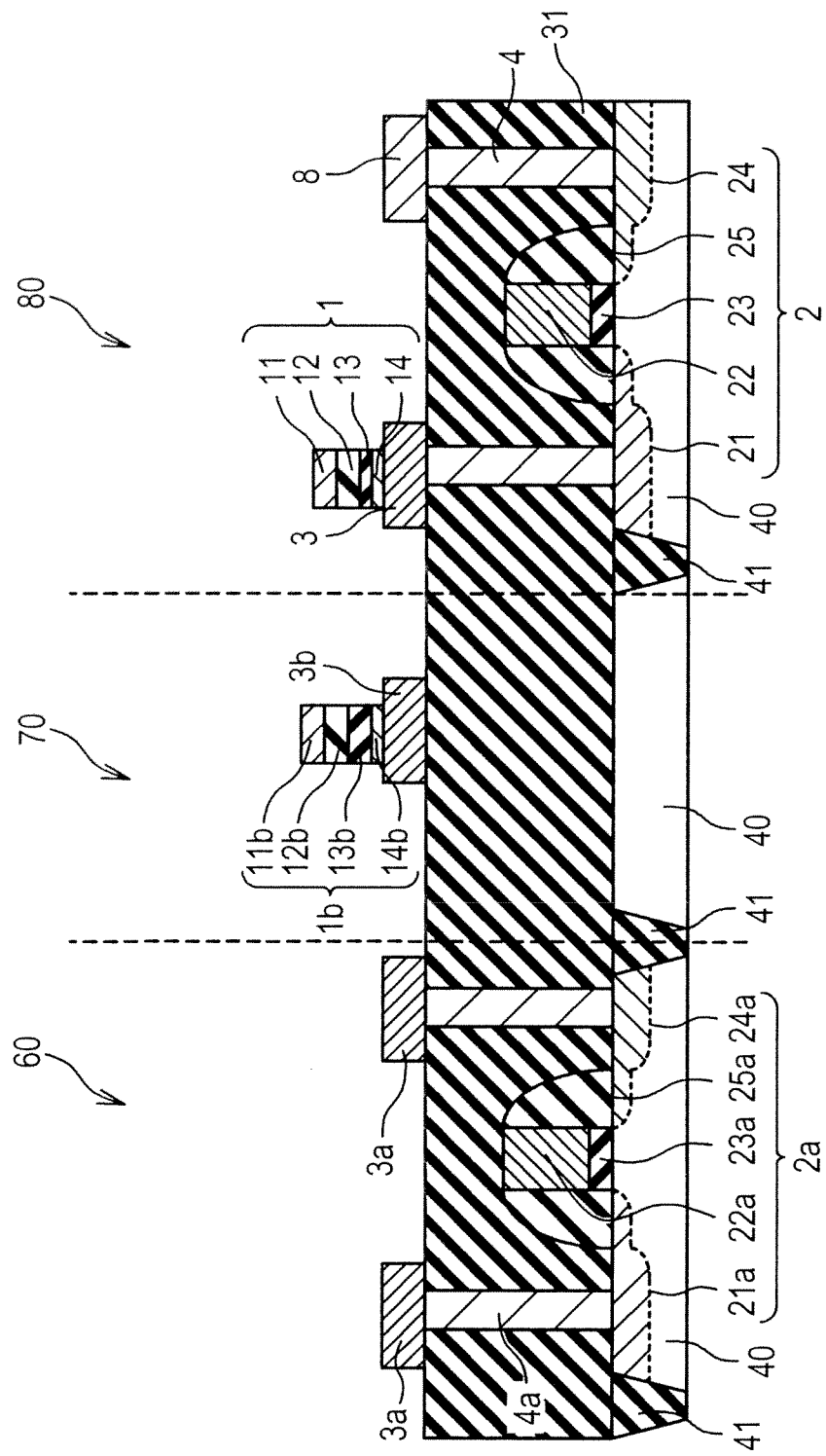

RESISTANCE CHANGE NONVOLATILE MEMORY DEVICE, SEMICONDUCTOR DEVICE, AND METHOD OF OPERATING RESISTANCE CHANGE NONVOLATILE MEMORY DEVICE

CROSS-REFERENCE TO RELATED APPLICATIONS

The disclosure of Japanese Patent Application No. 2011-200406 filed on Sep. 14, 2011 including the specification, drawings and abstract is incorporated herein by reference in its entirety.

BACKGROUND

The present invention relates to a resistance change nonvolatile memory device, a semiconductor device, and a method of operating a resistance change nonvolatile memory device.

In nonvolatile memory fields, there has been much research on flash memories, ferroelectric memories (Ferroelectric Random Access Memory; FeRAM), magnetic memories (Magnetic Random Access Memory; MRAM), OUM (Ovonic Unified Memory) and the like. As nonvolatile memories different from these related-art ones, however, resistance change memories (Resistance Random Access Memory; ReRAM) have recently been proposed. For example, a resistance change memory described in Non-patent Document 1 can write data by setting the resistance of a resistance change layer of a resistance change element in the memory cell by application of a voltage pulse. In addition, it can read data by measuring resistance in a non-destructive manner. This resistance change memory can be multivalued because memory cells have a small area. Therefore, it has a possibility exceeding the existing nonvolatile memories. In Non-patent Document 1, PCMO ($Pr_{0.7}Ca_{0.3}MnO_3$) and YBCO ($YBa_2Cu_3O_y$) are used as the resistance change layer.

There have also been proposals on resistance change memories. For example, Non-patent Document 2 or Non-patent Document 3 proposes, as a resistance change element of a resistance change memory, a stacked structure obtained by sandwiching two resistance change layers between an upper electrode and a lower electrode. FIG. 1A and FIG. 1B are cross-sectional views showing the configuration of the major portion of the resistance change memory proposed in Non-patent Document 2 or Non-patent Document 3. FIG. 1A shows one of the memory cells of a resistance change memory 150. This memory cell is equipped with a control transistor 102 and a resistance change element 101 (1T1R type). FIG. 1B shows this resistance change element 101. The resistance change element 101 has a stacked structure obtained by sandwiching a $Ta_2O_5$ layer as a first resistance change layer 112 and a $TiO_2$ layer as a second resistance change layer 113 between an upper electrode 111 and a lower electrode 114. The first resistance change layer 112 ($Ta_2O_5$ layer) and the second resistance change layer 113 ($TiO_2$ layer) have film thicknesses of, for example, 10 nm and 3 nm, respectively.

The control transistor 102 for memory cell is formed in the surface region of a semiconductor substrate 140. The control transistor 102 is equipped with a gate insulating film 123, a gate 122 (word line), a drain 121, a source 124, and a sidewall 125. Contacts 104 are coupled onto the drain 121 and the source 124, respectively. The control transistor 102 and the contacts 104 are covered with a first interlayer insulating film 131. The contact 104 on the side of the drain 121 is coupled to a first wiring 103. The resistance change element 101 is coupled to the first wiring 103. A first via 109 is coupled onto the resistance change element 101. A second wiring 106 (bit line) is coupled onto the first via 109. On the other hand, the contact 104 on the side of the source 124 is coupled to a common line 108. The first wiring 103, the resistance change element 101, the first via 109, and the common line 108 are covered with a second interlayer insulating film 132.

Next, a bipolar type switching method of the resistance change element 101 having the above-described $Ta_2O_5$ layer/$TiO_2$ layer (first resistance change layer 112/second resistance change layer 113) stacked structure will be described. The resistance of the resistance change element 101 in the initial state is 1 G$\Omega$ or greater. First, by applying a high voltage to (Forming) the resistance change element 101, a conduction path (filament) penetrating through the stacked structure is formed. This decreases the resistance of the resistance change element 101 (to 10 k$\Omega$ or less). This filament (conduction path) is presumed to be formed by the connection of oxygen vacancies in the $Ta_2O_5$ layer and the $TiO_2$ layer and it shows an ohmic conduction mechanism. Next, switching from the low resistance state (On state) to the high resistance state (Off state) occurs by application (Off operation) of a negative voltage (Off voltage) to the upper electrode 111. As a result, the resistance change element 101 has resistance as high as 0.01 M$\Omega$ or greater ($R_H$: Off resistance). In the Off resistance state, a tunnel barrier is formed in the $TiO_2$ layer and it divides the filament to increase the resistance. The $Ta_2O_5$ layer keeps its stable state once the filament is formed. Next, switching from the high resistance state (Off state) to the low resistance state (On state) occurs by application (On operation) of a positive high voltage (On voltage) to the upper electrode 111. As a result, the resistance of the resistance change element 101 has resistance as low as 10 k$\Omega$ or less ($R_L$: On resistance). Target values of the On operation condition and Off operation condition are desirably ±5V or less/10 $\mu$sec or less. Furthermore, Non-patent Document 3 reports that the resistance after Off operation can be multivalued by verification. Non-Patent Document 4 reports that an Off resistance value depends on the width of a tunnel barrier which has been formed in the $TiO_2$ layer so as to divide the filament.

As related technology, Japanese Patent Laid-Open No. 2008-21750 (Patent Document 1; corresponding U.S. Patent Application: US2008048164(A1)) discloses a resistance change element. This resistance change element has a first electrode, a second electrode, and a resistance change layer and an insulating layer stacked between the first electrode and the second electrode. The insulating layer has a thickness of 0.5 nm or greater but not greater than 5 nm. The resistance change layer is a layer which can be changed among two or more states different in electrical resistance by applying a voltage or current between the first electrode and the second electrode. The resistance change layer is composed mainly of a transition metal oxide.

Japanese Patent Laid-Open No. 2009-21524 (Patent Document 2) discloses a resistance change element. This resistance change element includes a substrate, a lower electrode and an upper electrode arranged on the substrate, and a resistance change layer arranged between the lower electrode and the upper electrode. In this resistance change element, there are two or more states different in electrical resistance between the lower electrode and the upper electrode. In this resistance change element, a change from one state selected from the two or more states to another state occurs by applying a drive voltage or current between the lower electrode and the upper electrode. The resistance change layer has a multilayer structure containing two or more films made of an oxide or oxynitride of tantalum, each film having a thickness of 2 nm or less.

Japanese Patent Laid-Open No. 2009-135370 (Patent Document 3) discloses a nonvolatile memory element. This nonvolatile memory element is equipped with a first electrode, a second electrode, and a resistance change layer inserted between the first electrode and the second electrode and undergoing a reversible change in resistance, depending on an electrical signal sent between the first electrode and the second electrode. The resistance change layer has a stacked structure containing at least a first oxide layer composed of an oxide of a transition metal different from tantalum and a second oxide layer composed of an oxide of tantalum. The second oxide layer has a thickness greater than that of the first oxide layer.

Japanese Patent Laid-Open No. 2009-212380 (Patent Document 4) discloses a resistance change memory. This resistance change memory includes a resistance change element having a resistance change layer sandwiched between a pair of electrodes. In this resistance change memory, the resistance change layer has a film stack of a polycrystalline oxide film and an amorphous oxide film thicker than the polycrystalline oxide film.

Japanese Patent Laid-Open No. 2010-21381 (Patent Document 5) discloses a nonvolatile memory element. This nonvolatile memory element is equipped with a first electrode, a second electrode, and a resistance change layer inserted between the first electrode and the second electrode and undergoing a reversible change in resistance, depending on an electrical signal applied between these electrodes. This nonvolatile memory element undergoes a reversible change in resistance between the first electrode and the second electrode, depending on polarity-different electrical signals applied between the first electrode and the second electrode. The resistance change layer has at least a stacked structure obtained by stacking a first oxygen-deficient zirconium oxide layer which is electroconductive and has a composition represented by $ZrO_x$ (wherein, $0.9 \le x \le 1.4$) and a second oxygen-deficient zirconium oxide layer which is electroconductive and has a composition represented by $ZrO_y$ (wherein, $1.9 < y < 2.0$).

Japanese Patent No. 4469023 (Patent Document 6; corresponding U.S. Patent Application No: US2011002154(A1)) discloses a nonvolatile memory element. This nonvolatile memory element is equipped with a first electrode, a second electrode, and a resistance change layer inserted between the first electrode and the second electrode and undergoing a reversible change in resistance, depending on an electrical signal applied between these electrodes. This nonvolatile memory element undergoes a reversible change in resistance between the first electrode and the second electrode, depending on polarity-different electrical signals applied between the first electrode and the second electrode. The resistance change layer has a stacked structure obtained by stacking a second oxygen-deficient hafnium oxide layer which is electroconductive and has a composition represented by $HfO_x$ (wherein, $0.9 \le x \le 1.6$) and a first oxygen-deficient hafnium oxide layer which is electroconductive and has a composition represented by $HfO_y$ (wherein, $1.8 < y < 2.0$).

WO2008/038365 (Patent Document 7; corresponding U.S. Pat. No. 7,764,160(B2)) discloses a resistance change element. This resistance change element has a stacked structure including a first electrode, a second electrode, an oxygen ion transfer layer placed between the first electrode and the second electrode and capable of forming a low resistance path made of oxygen voids due to transfer of oxygen ions in the layer, and an oxygen ion formation promoting layer which is placed between the oxygen ion transfer layer and the first electrode while being in contact with the oxygen ion transfer layer.

PATENT DOCUMENTS

Patent Document 1

Japanese Patent Laid-Open No. 2008-21750

Patent Document 2

Japanese Patent Laid-Open No. 2009-21524

Patent Document 3

Japanese Patent Laid-Open No. 2009-135370

Patent Document 4

Japanese Patent Laid-Open No. 2009-212380

Patent Document 5

Japanese Patent Laid-Open No. 2010-21381

Patent Document 6

Japanese Patent No. 4469023

Patent Document 7

WO2008/038365

NON-PATENT DOCUMENTS

Non-patent Document 1

W. W. Zhuang et. al., "Novel Colossal Magnetoresistive Thin Film Nonvolatile Resistance Random Access Memory (RRAM)", IEDM, Article Number: 7.5, pp. 193-196, 2002.

Non-patent Document 2

M. Terai et. al., "Effect of ReRAM-Stack Asymmetry on Read Disturb Immunity", IRPS Tech. Dig., p. 134-138, 2009.

Non-Patent Document 3

M. Terai et. al., "Resistance Controllability of $Ta_2O_5/TiO_2$ Stack ReRAM for Low-Voltage and Multilevel Operation", IEEE Electron Device Letter, Vol. 31, Issue. 3, pp. 204-206, 2010.

Non-Patent Document 4

Y. Sakotsubo et. al., "Physical Model for Reset State of $Ta_2O_5/TiO_2$-Stacked Resistance Random Access Memory", JJAP, Vol. 49, 04DD19, 2010.

SUMMARY OF THE INVENTION

As a result of tests, the present inventors have found, for the first time in the world, new problems of a resistance change memory shown in FIGS. 1A and 1B and mechanism thereof. Details will next be described.

First, the relationship between an Off resistance and an On-operation rate in switching from an Off state to an On state will be described.

FIG. 2A to FIG. 2C are graphs showing the transient response of a switching current upon Reset operation, On operation, and another On operation when the structure of the resistance change memory shown in FIG. 1A is used. The resistance change memory (resistance change element) used here has a structure of upper electrode/first resistance change layer/second resistance change layer/lower electrode=Ru/TaO (10 nm)/TiO (3 nm)/Ru.

FIG. 2A shows the transient response of a switching current upon Reset operation ($R_L$ (2 kΩ)→$R_H$ (1 GΩ)). The value (μA) of an Off current, the value (V) of an Off-voltage pulse, and time (nsec.) are plotted along the left ordinate, right ordinate, and abscissa, respectively. In this case, an Off-voltage pulse of −2.5V and 2 μsec was applied. As shown in this graph, the switching current (Off current) of a sample in a Set state shows a peak value (about −150 μA) immediately after application (Time=0 nsec) of an Off-voltage pulse, that is, about 100 nsec after application and after a time period less than 300 nsec, an increase in resistance completely stopped the current from flowing (0 μA). This means that switching to a high resistance state ($R_H$) is completed in a relatively early period of time less than 300 nsec.

FIG. 2B shows the transient response of a switching current upon On operation ($R_H$ (1 GΩ)→$R_L$ (1.5 kΩ)). The value (A) of an On current, the value (V) of an On-voltage pulse, and time (μsec.) are plotted along the left ordinate, right ordinate, and abscissa, respectively. In this case, an On-voltage pulse of +5V and 250 μsec was applied. As shown in this graph, a switching current (On current) from a high resistance state ($R_H$) of 1 GΩ to a low resistance state ($R_L$) did not undergo a change for long hours even after application of an On-voltage pulse (Time=0 μsec) and after passage of 300 μsec or greater after the pulse application was started, it increased as a result of a decrease in resistance (approximately −0.0002 A). This means that switching time to the low resistance state ($R_L$) is markedly different from the target value, supposing that the target value under On operation conditions is 10 μsec or less.

On the other hand, FIG. 2C shows the transient response of a switching current upon On operation ($R_H$ (1 MΩ)→$R_L$ (1.5 kΩ)). Similar to FIG. 2B, the value (A) of an On current, the value (V) of an On-voltage pulse, and time (μsec.) are plotted along the left ordinate, right ordinate, and abscissa, respectively. In this case, similar to FIG. 2B, an On-voltage pulse of +5V and 250 μsec was applied. As shown in this graph, a switching current (On current) from a high resistance state ($R_H$) of 1 MΩ to a low resistance state ($R_L$) increased (approximately −0.0002A) immediately after application of an ON-voltage pulse (Time=40 μsec), that is, several μsec after application by a decrease in resistance. This means that the switching time to a low resistance state ($R_L$) almost reaches the target value.

Based on the findings described above, time necessary for switching from a high resistance state ($R_H$) of 1 GΩ to a low resistance state ($R_L$) is greater than time necessary for switching from a high resistance state ($R_H$) of 1 MΩ to a low resistance state ($R_L$). This means that an On-operation rate is smaller when an Off resistance is high (1 GΩ) than when an Off resistance is low (1 MΩ). Thus, it has been elucidated that in switching from an Off state to an On state, an On-operation rate depends on an Off resistance.

Next, the relationship between an Off voltage and an On-operation success rate in switching from an Off state to an On state will be described.

FIG. 3A is a graph (Weibull plot) showing a resistance distribution when On-voltage pulses of from 2V to 7V are added to a plurality of samples in a high resistance state (Off state). The resistance (Ω) of a sample is plotted along the abscissa and Ln(−Ln(1−F)) relating to the probability (frequency) F of the sample having the resistance is plotted along the ordinate. The samples each have the configuration of FIG. 1A. Due to an increase in resistance from a low resistance state ($R_L$) by applying an Off-voltage pulse of −2.5V, they are in an OFF state. This graph shows a distribution of resistance when resistance reduction (On operation) is tried by applying an On-voltage pulse of from 2V to 9V (fixed at a pulse width of 2 μsec) to the samples in an Off state. FIG. 3B is a graph showing an On-operation (low resistance) success rate in the case of FIG. 3A. The voltage of an On voltage pulse is plotted along the abscissa and an On-operation success rate is plotted along the ordinate.

As shown in FIG. 3A, a resistance distribution (open triangle) after application of an On-voltage pulse of 2V did not show any change from an Off resistance distribution (open circle). By applying an On-voltage pulse of 3V or greater, however, memory cells having a low Off resistance gradually started a resistance decrease. Some memory cells however did not decrease their resistance even by application of an On-voltage pulse as high as 9V. It has been found that in particular, memory cells having higher Off resistance had difficulty in decreasing their resistance. As shown in FIG. 3B, when switching to an Off state was conducted by applying an Off-voltage pulse of −2.5V to increase a resistance, the On-operation (resistance decrease) success rate did not reach 100% at an On-voltage pulse of from 2 to 9V because of the presence of memory cells having a high Off resistance. Thus, it has been elucidated that memory cells having a high Off resistance became a factor for decreasing the On-operation success rate.

FIG. 4 shows dependence of an On-operation success rate on an Off voltage. A voltage of an ON-voltage pulse is plotted along the abscissa and an On-operation success rate is plotted along the ordinate. An open triangle shows the case of FIG. 3B. An open circle shows the case where the resistance was increased by application of an Off-voltage pulse of −2.0V to create an initial state and On-operation (resistance decrease) was tried as in the case of FIG. 3A. It is apparent from this graph that by decreasing the Off voltage (absolute value) (from an open triangle: −2.5V to an open circle: −2.0V), the On voltage can be decreased. This occurs because by decreasing the Off voltage (absolute value), the distribution of an Off resistance before On operation was shifted to a low resistance side. In other words, the number of memory cells having a high Off resistance decreased and the number of memory cells likely to decrease their resistance increased. As a result, an On-operation (resistance decrease) success rate reached 100%. It has thus been found that shifting the distribution of an Off resistance to the low resistance side contributes to a decrease in an On voltage and an increase in an On-operation success rate. However, the On voltage varied greatly.

Next, the relationship between the distribution of an Off resistance and an Off voltage in switching from an On state to an Off state.

FIG. 5 shows dependence of an On-state resistance distribution and an Off-state resistance distribution on an Off voltage. The resistance (Ω) of a sample is plotted along the abscissa and Ln(−Ln(1−F)) relating to a probability (frequency) F of the sample having the resistance is plotted along the ordinate. In this graph, a solid circle shows an On (low resistance) state and an open circle shows a state where resistance is made high by application of an Off-voltage pulse of −1.5V. An open square shows a state in which resistance is made high by application of an Off-voltage pulse of −2.0V. An open triangle shows a state in which resistance is made high by application of an Off-voltage pulse of −2.5V. As shown in this graph, it has been elucidated that in each case, when Off-operation (resistance increase) is conducted under same conditions, the Off-resistance varies greatly among memory cells. A verifying operation is necessary in order to reduce such variations in Off resistance. The verifying operation however requires much time.

Next, the mechanism causing the above problems will be described.

FIG. 6 is a schematic view showing an On-operation mechanism in the resistance change element having the configuration shown in FIG. 1A. FIG. 6 has, on the top thereof, a schematic view of a resistance change element 101. In FIG. 6, (a) is a graph showing a barrier in a second resistance change layer 113 of the resistance change element 101 in a high-resistance state (Off state: Off resistance $R_{H1}$); (b) is a graph showing a barrier in the second resistance change layer 113 of the resistance change element 101 in a low resistance state (On state: On resistance $R_L$); (c) is a graph showing a barrier in the second resistance change layer 113 of the resistance change element 101 in another high resistance state (Off state: Off resistance $R_{H2}(>R_{H1})$); and (d) is a graph showing a barrier in the second resistance change layer 113 of the resistance change element 101 in a low resistance state (On state: On resistance $R_L$).

In a $TiO_x$ (second resistance change layer 113)/$TaO_x$ (first resistance change layer 112) stack, filaments 116 and 115 showing ohmic conduction by a Forming operation are formed. Then, by Off operation, a tunnel barrier B which divides the filament 116 is formed in the second resistance change layer 113 ($TiO_x$) (FIG. 6(a)) and increases a resistance. The filament 16 is however presumed to remain. An increase in an Off voltage increases the width of the tunnel barrier B, leading to higher resistance ($R_{H1}>R_{H2}$) (FIG. 6(c)). The filament 16 is presumed to still remain. When an Off voltage is increased further, the width of the tunnel barrier B becomes equal to the width of the second resistance change layer 113 (the maximum Off resistance). Here, the filament 16 is presumed to disappear for the first time.

Based on these findings, variations in Off resistance by the Off operation presumed to occur because of a difference in the width of the tunnel barrier B among memory cells as shown in FIG. 6(a) and FIG. 6(c). In other words, variations in Off resistance when Off operation is conducted are presumed to occur because of a difference in the length of the filament 116 among memory cells. On the other hand, the On operation is presumed to be a mechanism working to break this tunnel barrier B by a stress field or stress current upon application of an On voltage (FIG. 6(b), FIG. 6(d)). These variations in an On voltage when On operation is conducted are therefore presumed to occur because the On voltage required for breaking the tunnel barrier B varies due to a difference in the width of the tunnel barrier B among memory cells, that is, a difference in Off resistance as shown in FIG. 6(a) and FIG. 6(c).

There is accordingly a demand for the development of a technology capable of realizing, in resistance change nonvolatile memory devices, a low-voltage and high-speed switching behavior while reducing variations.

A means for overcoming the above problems will hereinafter be described using a number or symbol used in the mode for carrying out the invention. These numbers or symbols are shown in parentheses to clarify the corresponding relationship between the description in the claims and the mode for carrying out the invention. These numbers or symbols should not be used for construing the technical scope of the invention described in the claims.

The resistance change nonvolatile memory device of the invention is equipped with a first electrode (14), a resistance change portion (18) provided on the first electrode (14), and a second electrode (11) provided on the resistance change portion (18). The resistance change portion (18) is provided on the first electrode (14) and is equipped with a resistance change layer (13) undergoing a change in resistance by an applied voltage and a stable layer (12) provided on the resistance change layer (13) and forming a filament. The resistance change layer and the stable layer are made of different metal oxides, respectively. The oxide formation energy of the resistance change layer is higher than the oxide formation energy of the stable layer. The resistance change layer (13) has such a film thickness as to permit the resistance of the resistance change portion in an Off state to fall within a range determined by the film thickness.

The semiconductor device of the invention is equipped with a memory portion (80) having a plurality of memory cells (MC) and a logic portion (60) conducting data processing by making use of the memory portion (80). The memory cells (MC) each have the resistance change nonvolatile memory device (1) described in the above paragraph.

In the method of operating the resistance change nonvolatile memory device of the invention, the resistance change nonvolatile memory device is equipped with a first electrode (14), a resistance change portion (18) provided on the first electrode (14), and a second electrode (11) provided on the resistance change portion (18). The resistance change portion (18) is provided on the first electrode (14) and is equipped with a resistance change layer (13) undergoing a change in resistance by an applied voltage and a stable layer (12) provided on the resistance change layer (13) and forming a filament. The resistance change layer and the stable layer are made of different metal oxides, respectively. The oxide formation energy of the resistance change layer is higher than the oxide formation energy of the stable layer. The resistance change layer (13) has such a film thickness as to permit the resistance of the resistance change portion in an Off state to fall within a range determined by the film thickness. The method of operating the resistance change nonvolatile memory device has a step of, when Forming the resistance change portion (18), applying a Forming voltage between the first electrode (14) and the second electrode (11) to form a filament in the resistance change layer (13) and the stable layer (12), a step of, when the resistance change portion (18) is changed to be in an Off state, applying an Off voltage between the first electrode (14) and the second electrode (11) to remove the filament from the resistance change layer (13), and a step of, when the resistance change portion (18) is changed to be in an On state, applying an On voltage between the first electrode (14) and the second electrode (11) to form a filament of the resistance change layer (13).

The invention makes it possible to realize, in a resistance change nonvolatile memory device, a low-voltage and high-speed switching behavior while reducing variations.

BRIEF DESCRIPTION OF THE DRAWINGS

FIG. 6 is a schematic view showing the On-operation mechanism in the resistance change element having the configuration of FIG. 1A;

FIG. 7 includes a cross-sectional view showing the configuration of the resistance change element in the resistance change nonvolatile memory device according to a first embodiment of the invention and a graph showing a potential which an electron senses in an Off state;

FIG. 18A is a cross-sectional view showing one example of the configuration of the semiconductor device according to the third embodiment of the invention;

FIG. 20A is a cross-sectional view showing a method of manufacturing the semiconductor device according to the third embodiment of the invention;

FIG. 20C is a cross-sectional view showing the method of manufacturing the semiconductor device according to the third embodiment of the invention;

FIG. 20F is a cross-sectional view showing the method of manufacturing the semiconductor device according to the third embodiment of the invention.

DETAILED DESCRIPTION

Figure 1A:
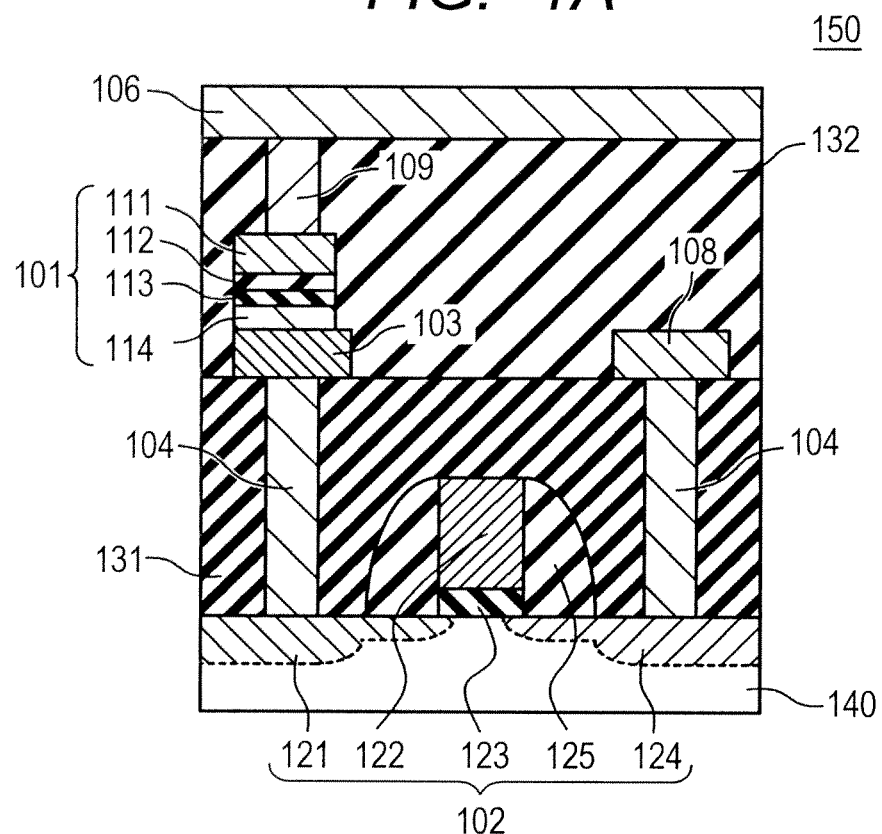
FIG. 1A is a cross-sectional view showing the configuration of a major portion of the resistance change memory proposed in Non-patent Document 2 or Non-patent Document 3.

The resistance change nonvolatile memory device, semiconductor device, and method of operating a resistance change nonvolatile memory device according to the embodiments of the invention will hereinafter be described referring to accompanying drawings.

First Embodiment

The configuration of the resistance change nonvolatile memory device according to the first embodiment of the invention will be described referring to accompanying drawings. FIG. 7 includes a cross-sectional view showing the configuration of a resistance change element in the resistance change nonvolatile memory device according to the first embodiment of the invention and a graph showing a potential which an electron senses in an Off state. A resistance change element 1 according to the present embodiment is equipped with a lower electrode 14, a resistance change portion 18 provided on the lower electrode 14, and an upper electrode 11 provided on the resistance change portion 18. This resistance change element 1 is a filament type in which a conduction path (filament) is formed in a portion of the resistance change portion 18 by a first Forming operation. A portion of the filament thus formed functions to switch between an On state (low resistance state) and an Off state (a high resistance state). Magnitudes of resistance in respective states have the following relationship: (Resistance in initial state before Forming)>(resistance in Off state)>(resistance in On state), in short, (initial resistance)>(Off resistance)>(On resistance). Accordingly, this resistance change element 1 operates in a resistance region lower than the initial resistance before Forming (On state and Off state).

The resistance change portion 18 is equipped with a resistance change layer 13 and a stable layer 12. The resistance change layer 13 is provided on the lower electrode 14 and the resistance of it changes with a voltage applied thereto. This means that it has a decreased resistance or increased resistance, responding to On operation (resistance decreasing operation) to create an On state or Off operation (resistance increasing operation) to create an Off state. The stable layer 12 is provided on the resistance change layer 13 and forms a stable filament by Forming operation. Once the filament is formed, it is maintained stably irrespective of the On operation to create an On state or the Off operation to create an Off state. This means that the stable layer 12 in which the filament has been formed has a low resistance. It is to be noted that the resistance change layer 13 and the stable layer 12 may be stacked in reverse order.

Accordingly, the Off resistance of this resistance change element 1 is roughly equal to the initial resistance (resistance before Forming) of the resistance change layer 13. In other words, the Off resistance is determined by the resistance of the resistance change layer 13 and a change in the resistance of the resistance change portion 18 is roughly equal to the resistance change of the resistance change layer 13. At this time, the film thickness of the resistance change layer 13 is preferably equal to the width of a tunnel barrier B0 formed in the Off state. This means that the film thickness of the resistance change layer 13 is preferably equal to the width of a tunnel barrier B0 formed at the lowest value of the Off voltage applied by Off operation. Alternatively, the film thickness of the resistance change layer 13 does not depend on the magnitude of an Off voltage to be applied by Off operation but is preferably such a film thickness as to allow the Off resistance to fall within a range limited (determined) by the film thickness of the resistance change layer 13. In other words, the resistance change element 1 operates preferably within a range in which the maximum value of the Off resistance is limited (determined) by the film thickness of the resistance change layer 13.

Even if the Off voltage to be applied to the resistance change layer 13 differs by the resistance change element 1 due to, for example, variations in film thickness of the resistance change layer 13, if the resistance change layer 13 is thin enough, the filament (16) of the resistance change layer 13 disappears in any resistance change element 1. This means that in any of the resistance change elements 1, a tunnel barrier formed therein has a width equal to the film thickness of the resistance change layer 13 and it shows the Off resistance of the resistance change layer 13 itself having no filament (16).

The resistance change layer 13 and the stable layer 12 are made of different metal oxides, respectively. The oxide formation energy of the resistance change layer 13 is preferably higher than the oxide formation energy of the stable layer 12. The reason of it will be described later. When the stable layer 12 is made of, for example, $Ta_2O_5$ (oxide formation energy: $\Delta Hf/Oxygen=409.2$ eV), the resistance change layer 13 is preferably made of, for example, titanium oxide ($TiO_2$: $\Delta Hf/Oxygen=472.5$ eV), aluminum oxide ($Al_2O_3$: $\Delta Hf/Oxygen=558$ eV), zirconium oxide ($ZrO_2$: $\Delta Hf/Oxygen=550.3$ eV), or hafnium oxide ($HfO_2$: $\Delta Hf/Oxygen=572.5$ eV). The material of the resistance change layer may contain, in addition, a dissimilar metal such as aluminum (Al), cobalt (Co), chromium (Cr), titanium (Ti), or lithium (Li). On the other hand, the material of the stable layer 12 is not limited to $Ta_2O_5$, but any material having an oxide formation energy lower than that of the resistance change layer 13 can produce the advantage of the present embodiment. For example, a similar advantage can be obtained by using, for example, silicon oxide ($SiO_2$: $\Delta Hf/Oxygen=455V$), cobalt oxide (CoO: $\Delta Hf/Oxygen=237V$), or tungsten oxide ($WO_3$: $\Delta Hf/Oxygen=280V$) as the stable layer 12 and using it in combination with the above-described resistance change layer 13.

The lower electrode 14 and the upper electrode 11 are not limited insofar as they have conductivity fundamentally. The lower electrode 14 and the upper electrode 11 may be made of, for example, gold (Au), nickel (Ni), cobalt (Co), platinum (Pt), ruthenium (Ru), tungsten (W), iridium (Ir), titanium (Ti), copper (Cu), tantalum (Ta), iridium-tantalum alloy (Ir—Ta), or indium tin oxide (ITO), an alloy thereof, or an oxide, nitride, fluoride, carbide, or silicide thereof. Alternatively, these electrodes may be made of a film stack of these materials.

The behavior of the resistance change nonvolatile memory device according to the first embodiment of the invention will next be described referring to accompanying drawings. FIG. 8A to FIG. 8E are a schematic view of a filament of the resistance change element in the resistance change nonvolatile memory device according to the first embodiment of the invention and a graph showing a potential which a carrier senses. However, FIG. 8A, FIG. 8B, FIG. 8C, FIG. 8D, and FIG. 8E show the filament of the resistance change element 1 and a potential which an electron senses in an initial state of the resistance change element 1, in a low resistance state ($R_L$) after Forming, in a high resistance state ($R_{H1}$) after Off operation, in a low resistance state ($R_L$) after On operation, and in a high resistance state ($R_{H1}$) after Off operation, respectively.

In the initial state (FIG. 8A), a conduction path has not yet been formed in the resistance change layer 13/stable layer 12 (resistance change portion 18) sandwiched between the lower electrode 14 and the upper electrode 11 and a wide potential barrier is formed. At this time, the initial resistance between the lower electrode 14 and the upper electrode 11 (resistance change portion 18) is 1 GΩ or greater. In addition, an initial conduction path corresponds to an entire contact surface between the lower electrode 14 and the upper electrode 11, and the resistance change portion 18 so that the resistance depends on the area of the electrodes and a resistance increases with a decrease in the area of the electrodes. In addition, the resistance depends on the thicknesses of the resistance change layer 13 and the stable layer 12 and with an increase in the thickness of each of the layers, the resistance increases.

Figure 8A:
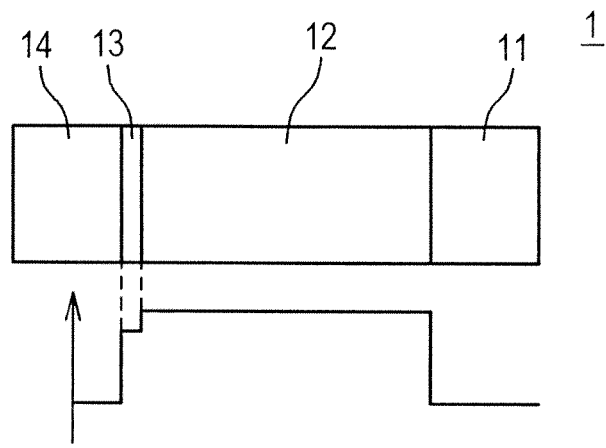
FIG. 8A includes a schematic view of a filament of the resistance change element in the resistance change nonvolatile memory device according to the first embodiment of the invention and a graph showing a potential which a carrier senses.
Figure 8B:
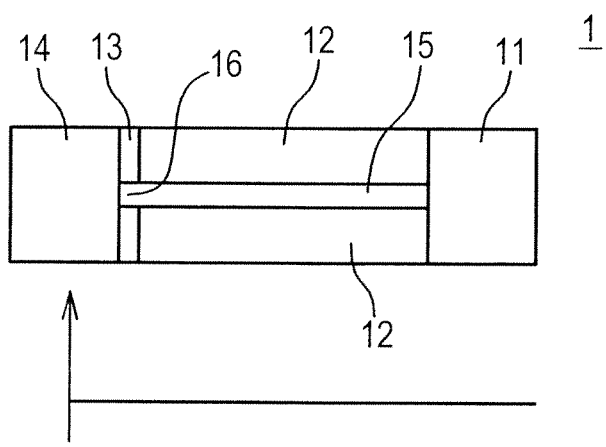
FIG. 8B includes a schematic view of a filament of the resistance change element in the resistance change nonvolatile memory device according to the first embodiment of the invention and a graph showing a potential which a carrier senses.

Next, a voltage (here, a voltage of +5V to the upper electrode 11) is applied to between the lower electrode 14 and the upper electrode 11. As a result, a conduction path (filaments 15 and 16) are formed so as to penetrate through the resistance change portion 18 (Forming) (FIG. 8B). Forming is a soft breakdown mechanism of an insulating film. A voltage necessary for Forming therefore depends on the thicknesses of the resistance change layer 13 and the stable layer 12. With an increase in the thickness of each of the layers, a voltage necessary for Forming increases. The filaments 15 and 16 are made of oxygen vacancies connected to each other in the resistance change layer 13/stable layer 12. When the filaments 15 and 16 are formed, the resistance change portion 18 is in a low resistance state ($R_L$) and it has a resistance of 10 kΩ or less. The filaments 15 and 16 show an ohmic conduction mechanism (linear current characteristics relative to applied voltage). The filaments 15 and 16 are formed in a portion of a contact surface so that the resistance after formation of the filaments 15 and 16 does not depend on the area of the electrodes. Since the resistance change portion 18 has the filaments 15 and 16 therein, a potential barrier disappears.

Figure 8C:
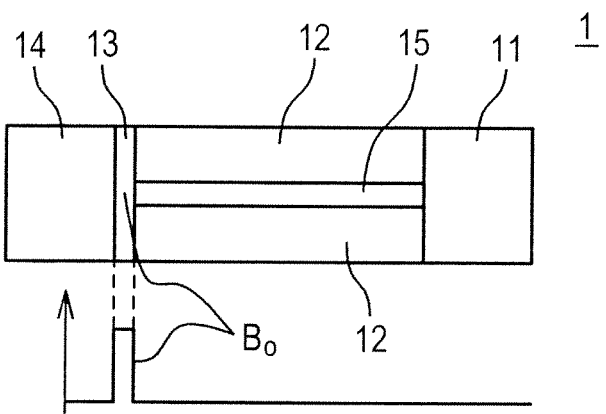
FIG. 8C includes a schematic view of a filament of the resistance change element in the resistance change nonvolatile memory device according to the first embodiment of the invention and a graph showing a potential which a carrier senses.

Next, a negative voltage (Off voltage) is applied to the upper electrode 11 to increase the resistance of the resistance change portion 18 (Off operation) (FIG. 8C). As a result, a tunnel barrier (potential barrier) is formed again in the resistance change layer 13 so as to cut the filament 16. The conduction mechanism becomes a tunnel-like one and the resistance change portion 18 (resistance change layer 13) has increased resistance ($R_{H1}$). Here, dependence of a resistance after Off operation on the thickness of the resistance change layer 13 and an Off voltage will hereinafter be studied.

Figure 9:
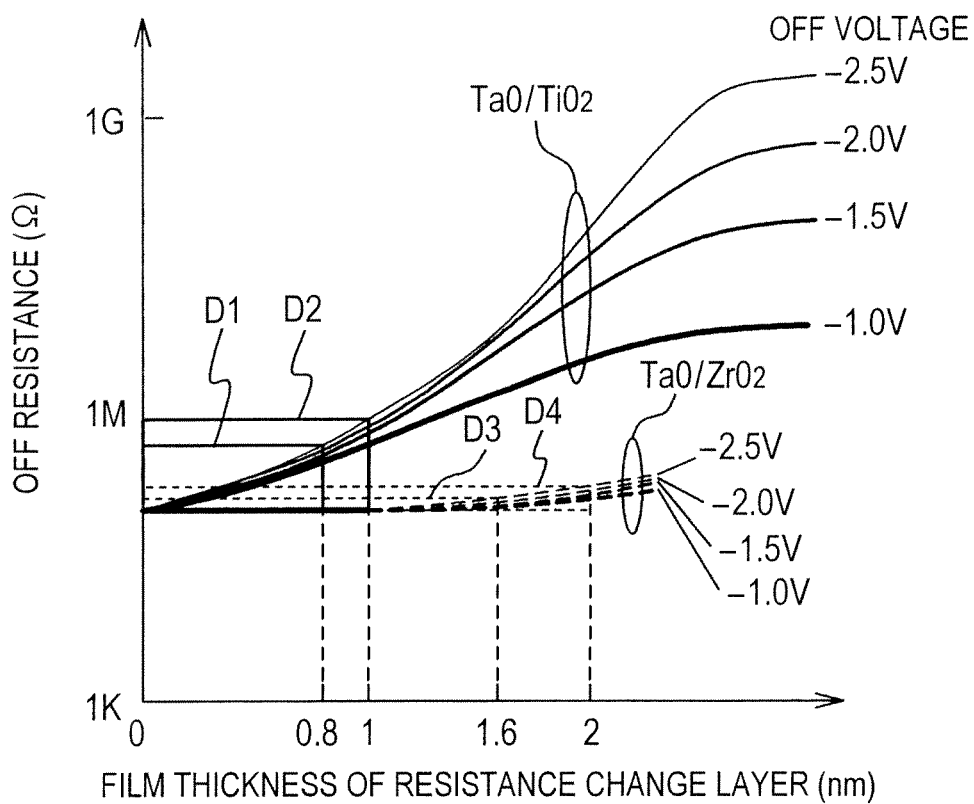
FIG. 9 is a graph showing dependence of resistance after Off operation on the film thickness of the resistance change layer 13 and an Off voltage.

FIG. 9 is a graph showing the dependence of a resistance after Off operation on the thickness of the resistance change layer 13 and an Of voltage. The Off resistance (Ω) is plotted along the ordinate, while the thickness (nm) of the resistance change layer 13 is plotted along the abscissa. This graph includes two cases, that is, using $Ta_2O_5$ as the stable layer 12 and $TiO_2$ as the resistance change layer 13 (indicated as "TaO/$TiO_2$") and using $Ta_2O_5$ as the stable layer 12 and $ZrO_2$ as the resistance change layer 13 (indicated as "TaO/$ZrO_2$"). In each of these cases, the lines show, from the top, an Off voltage of −2.5V, −2.0V, −1.5V, and −1.0V.

First, a description will be made on the resistance change layer 13 using $TiO_2$. As shown in this graph, when the resistance change layer 13 is thick, the Off resistance largely depends on the Off voltage. For example, when the thickness of the resistance change layer 13 exceeds 2 nm, the Off resistance varies greatly, depending on the Off voltage. This occurs because the resistance increase by the Off operation is partly based on the diffusion of oxygen ions by the electric field in the resistance change layer 13 when an Off voltage is applied. When a high voltage is applied, recovery from a large number of oxygen vacancies occurs due to transfer of oxygen ions to form a tunnel barrier in the resistance change layer 13, leading to a resistance increase. A diffusion amount of oxygen ions due to the electric field in the resistance change layer 13 however differs among memory cells so that resistance after the Off operation varies greatly among memory cells.

In the present embodiment, it has been found that by making the oxide formation energy of the resistance change layer 13 higher than that of the stable layer 12, recovery from oxygen vacancies occurs only in the resistance change layer 13 selectively by Off operation (application of a relatively positive voltage to an electrode in contact with the resistance change layer 13). In addition, it has also been found that by using it, a variation range of an Off resistance can be controlled by the material of the resistance change layer 13 and the thickness of the resistance change layer 13. It has been found further that since the oxide formation energy of the resistance change layer 13 in which a tunnel barrier is formed is high, no oxygen diffusion occurs even by storage at high temperatures and as a result, excellent high-temperature stability can be achieved. For example, in this graph, at a thickness of the resistance change layer 13 less than 1 nm, the Off resistance becomes equal to the initial resistance of the resistance change layer 13 (resistance of a single resistance change layer 13 before Forming). This means that when the resistance change layer 13 is formed as an ultrathin layer (within a range of D2 in the drawing), the tunnel barrier width after Off operation is self-limited by the thickness of the resistance change layer 13. At an Off voltage not greater than −1V (1V or greater in absolute value), dependence of Off resistance on Off voltage cannot be observed. In other words, variations in Off resistance can be reduced by using an operation region in which the thickness of the resistance change layer 13 becomes equal to the tunnel barrier width after Off operation. The Off operation when a negative voltage is applied to the upper electrode 11 is shown here, which can similarly apply to the Off operation when a positive voltage is applied to the lower electrode 14.

When $TiO_2$ is used as the resistance change layer 13, the above-described condition can therefore be satisfied by decreasing the thickness of the resistance change layer 13 to not greater than a predetermined film thickness inherent to the material of the resistance change layer 13 so as to make the layer to fall within the range of D2. This makes it possible to reduce a variation in the Off resistance. Here, as one example, D2 is shown as a preferable film thickness range of the resistance change layer 13 when an 8-nm thick tantalum oxide ($Ta_2O_5$: ΔHf/Oxygen=409.2 eV) film is used as the stable layer 12 and titanium oxide ($TiO_2$: ΔHf/Oxygen=472.5 eV) is used as the resistance change layer 13. In this case, by adjusting the thickness of the resistance change layer 13 to greater than 0 (within a film formable range) but less than 1 nm, variations in Off resistance can be reduced. It is more preferred to adjust the thickness of the resistance change layer 13 to greater than 0 (film formable range) but less than 0.8 nm so that it falls within the range of D1 shown in the graph. Incidentally, since the stable layer 12 forms the filament 15 stably, the film thickness is not limited to the above-described value.

The above D1 and D2 show preferable ranges of the thickness of the resistance change layer 13 when an 8-nm thick tantalum oxide (ΔHf/Oxygen=409.2 eV) film is used as the stable layer 12 and titanium oxide (ΔHf/Oxygen=472.5 eV) is used as the resistance change layer 13. In this case, a difference in the oxide formation energy between the stable layer 12 and the resistance change layer 13 is 63.3 eV. Based on the above description, however, a further increase in the difference in the oxide formation energy between the stable layer 12 and the resistance change layer 13 is presumed to reduce variations in Off resistance further. An example using $ZrO_2$ as the resistance change layer 13 to reduce variations will next be described.

For example, an 8-nm thick tantalum oxide ($Ta_2O_5$: ΔHf/Oxygen=409.2 eV) is used as the stable layer 12 and zirconium oxide ($ZrO_2$: ΔHf/Oxygen=550.3 eV) is used as the resistance change layer 13. In this case, a difference in oxide formation energy between the stable layer 12 and the resistance change layer 13 is 141.1 eV, which is more than twice the difference when $TiO_2$ is used as the resistance change layer 13. Accordingly, a preferable range of the thickness of the resistance change layer 13 is also presumed to become more than twice that of the resistance change layer 13 using $TiO_2$.

The graph also shows a preferable range D4 of the thickness of the resistance change layer 13 when a 6-nm thick tantalum oxide ($Ta_2O_5$: ΔHf/Oxygen=409.2 eV) film is used as the stable layer 12 and zirconium oxide ($ZrO_2$: ΔHf/Oxygen=550.3 eV) is used as the resistance change layer 13. In this case, the thickness of the resistance change layer 13 can be made greater than 0 (within a film formable range) and less than 2 nm, more preferably the range shown by D3 (within a film formable range), that is, greater than 0 but less than 1.6 nm. This makes it possible to reduce variations in Off resistance. Incidentally, the stable layer 12 forms the filament 15 stably so that the film thickness of it is not limited to the above range.

Even when zirconium oxide ($ZrO_2$) is replaced by hafnium oxide ($HfO_2$: ΔHf/Oxygen=572.5 eV) or aluminum oxide ($Al_2O_3$: ΔHf/Oxygen=558.6 eV), their oxide formation energy is close to that of zirconium oxide so that a preferable range of the film thickness of them is almost equal to that of zirconium oxide.

When some variations in the Off resistance are permitted, it is preferably 10 MΩ or less, because low Off resistance contributes to stabilization of the On operation. It is more preferably 1 MΩ or less, still more preferably 0.7 MΩ or less. Although no particular limitation is imposed, the realistic lower limit of the Off resistance is presumed to be about 1 kΩ in consideration of the material, film thickness, or the like.

Figure 8D:
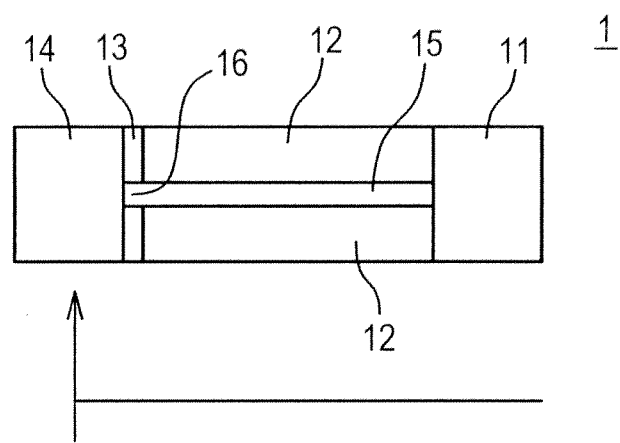
FIG. 8D includes a schematic view of a filament of the resistance change element in the resistance change nonvolatile memory device according to the first embodiment of the invention and a graph showing a potential which a carrier senses.

Next, a positive high voltage (On voltage) is applied to the upper electrode 11 to decrease the resistance of the resistance change portion 18 (On operation) (FIG. 8D). By the electric field applied, oxygen vacancies are formed again in the resistance change layer 13 and a tunnel barrier (potential barrier) disappears, causing a resistance decrease again ($R_L$). The mechanism of On operation works to break the tunnel barrier which has been formed in the resistance change layer 13 by Off operation so that an On voltage and On speed largely depend on an Off resistance (description in Background: FIG. 2 to FIG. 6). In the present embodiment, by controlling the width of the tunnel barrier to a predetermined small range and preventing variations in the width (to make the thickness of the resistance change layers 13 equal to each other), variations in Off resistance can be reduced and variations in On voltage and On speed can also be reduced.

Figure 8E:
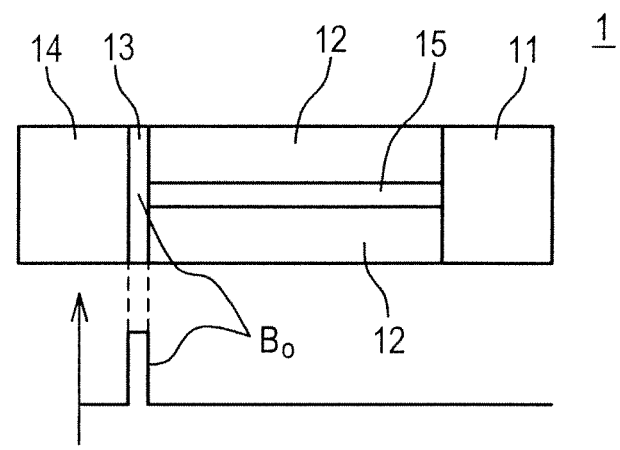
FIG. 8E includes a schematic view of a filament of the resistance change element in the resistance change nonvolatile memory device according to the first embodiment of the invention and a graph showing a potential which a carrier senses.

Then, by applying a voltage to the upper electrode 11, formation (FIG. 8C) and disappearance (FIG. 8D) of a tunnel barrier limited by the film thickness of the resistance change layer 13 occur in the resistance change layer 13 so that switching between Off state (FIG. 8C) and On state (FIG. 8D) can be repeated. For example, a voltage (Off voltage) is applied to the upper electrode 11 to increase the resistance of the resistance change portion 18 (Off operation) (FIG. 8E). Then, a tunnel barrier (potential barrier) is formed again in the resistance change layer 13 in a self-limiting manner so as to cut the filament 16 and due to a tunnel-like conduction mechanism, the resistance change portion 18 (resistance change layer 13) has an increased resistance ($R_{H1}$).

Thus, it has been found in the present embodiment that an Off state resistance can be controlled by the film thickness of the resistance change layer 13. By operating based on the finding so as to determine the Off state resistance by the film thickness of the resistance change layer 13, variations in Off resistance can be reduced and also variations in On operation can be reduced. This means that by making the Off resistance equal to the resistance determined by the film thickness of the resistance change layer 13 or by making the thickness of the resistance change layer 13 equal to the tunnel barrier width in the Off state, variations in Off resistance can be reduced and also variations in On operation can be reduced.

When the present embodiment is used, even without carrying out a verifying operation, Off resistance can be limited by the material or film thickness of the resistance change layer 13 and variations in Off resistance can be reduced. Moreover, reduction in variations in Off resistance leads to realization of voltage reduction and speed-up of On operation.

The invention can be applied to any filament-type resistance change element having a stacked structure of a stable layer and a resistance change layer between electrodes and forming a filament first.

Second Embodiment

The configuration of a resistance change nonvolatile memory device according to a second embodiment of the invention will next be described referring to accompanying drawings. In the second embodiment, the resistance change element according to the first embodiment is applied to a 1T1R (1 transistor 1 resistor) type resistance change memory (ReRAM). The second embodiment will hereinafter be described in detail.

Figure 10A:
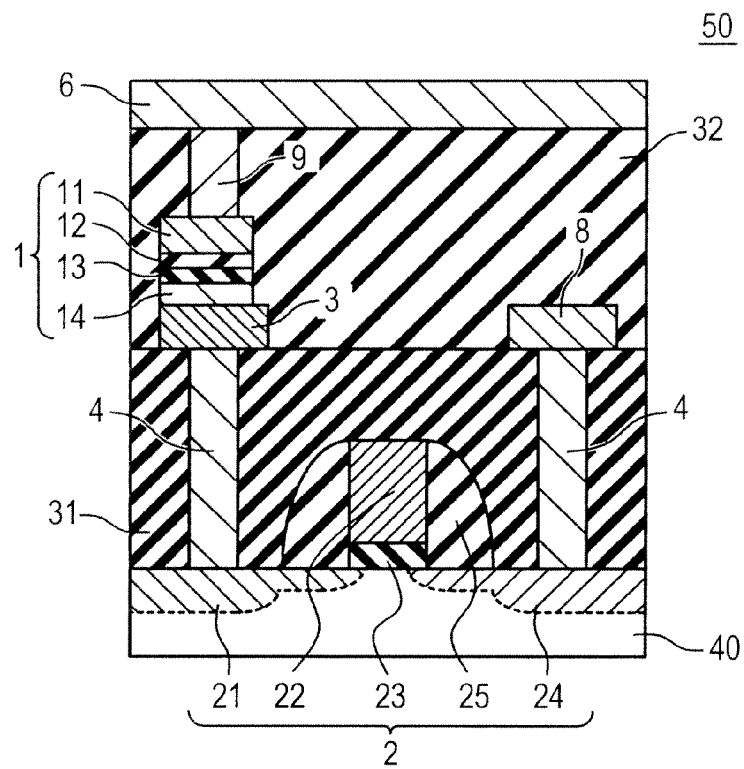
FIG. 10A is a cross-sectional view showing the configuration of the major portion of the resistance change nonvolatile memory device according to a second embodiment of the invention.
Figure 10B:
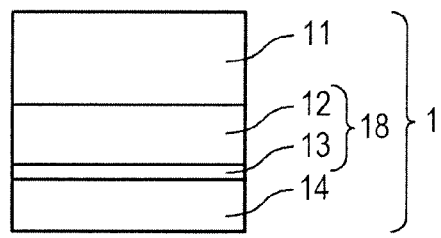
FIG. 10B is a cross-sectional view showing the configuration of the major portion of the resistance change nonvolatile memory device according to the second embodiment of the invention.

FIG. 10A and FIG. 10B are cross-sectional views showing the configuration of the major portion of the resistance change nonvolatile memory device according to the second embodiment of the invention. FIG. 10A shows one memory cell in the resistance change nonvolatile memory device 50. The memory cell is equipped with a control transistor 2 and a resistance change element 1 (1T1R type). FIG. 1B shows the resistance change element 1. The resistance change element 1 has a stacked structure obtained by sandwiching a stable layer 12 and a resistance change layer 13 between an upper electrode 11 and a lower electrode 14. The thicknesses of the stable layer 12 and the resistance change layer 13 are, for example, 8 nm and 0.8 nm, respectively.

The control transistor 2 of the memory cell is formed in a surface region of a conductor substrate 40. The control transistor 2 is equipped with a gate insulating film 23, a gate 22

(word line), a drain 21, a source 24, and a sidewall 25. Contacts 4 are coupled to the drain 21 and the source 24, respectively. The control transistor 2 and each of the contacts 4 are covered with a first interlayer insulating film 31. The contact 4 on the side of the drain 21 is coupled to a first wiring 3 of a first-level wiring layer (Metal 1). The resistance change element 1 is provided on the first wiring 3 and coupled to the first wiring 3. A via 9 is coupled onto the resistance change element 1. The via 9 is coupled to a second wiring 6 (bit line) on a second-level wiring (Metal 2). On the other hand, the contact 4 on the side of the source 24 is coupled to a common line 8. The first wiring 3, the resistance change element 1, the via 9, and the common line 8 are covered with a second interlayer insulating film 32.

The resistance change element 1 is as described in the first embodiment. The oxide formation energy of the resistance change layer 13 is preferably higher than that of the stable layer 12. When the oxide formation energy of the resistance change layer 13 is higher, recovery from oxygen vacancies in the resistance change layer 13 occurs selectively and Off operation is conducted only in the resistance change layer 13 but almost not in the stable layer 12. This makes it possible to produce the advantage of the first embodiment.

Examples of the material of the resistance change layer 13 include titanium oxide ($TiO_2$), aluminum oxide ($Al_2O_3$), zirconium oxide ($ZrO_2$), and hafnium oxide ($RfO_2$). These materials may contain a dissimilar metal such as aluminum (Al), cobalt (Co), chromium (Cr), titanium (Ti), or lithium (Li). In the present embodiment, zirconium oxide ($ZrO_2$) is used. Film thickness of zirconium oxide ($ZrO_2$) is set at 0.8 nm. Examples of the stable layer 12 include tantalum oxide ($Ta_2O_5$), silicon oxide ($SiO_2$), cobalt oxide (CoO), and tungsten oxide ($WO_3$). In the present embodiment, amorphous tantalum oxide ($Ta_2O_5$) is used. The thickness of tantalum oxide ($Ta_2O_5$) is set at 8 nm.

The lower electrode 14 and the upper electrode 11 are not limited insofar as they have conductivity fundamentally. The lower electrode 14 and the upper electrode 11 may be made of, for example, gold (Au), nickel (Ni), cobalt (Co), platinum (Pt), ruthenium (Ru), tungsten (W), iridium (Ir), titanium (Ti), copper (Cu), tantalum (Ta), iridium-tantalum alloy (Ir—Ta), or indium tin oxide (ITO), an alloy thereof, or an oxide, nitride, fluoride, carbide, or silicide thereof. Alternatively, these electrodes may be made of a film stack of these materials.

In the resistance change element 1 of the present embodiment, zirconium oxide is used as the resistance change layer 13. A difference in oxide formation energy between zirconium oxide ($ZrO_2$: $\Delta Hf/Oxygen=550.3$ eV) and tantalum oxide ($Ta_2O_5$: $\Delta Hf/Oxygen=409.2$ eV) is greater than that between titanium oxide ($TiO_2$: $\Delta Hf/Oxygen=472.5$ eV) used in the first embodiment and tantalum oxide. As a result, recovery from oxygen vacancies in Off operation can be achieved with a higher selectivity, leading to a great Improvement in controllability of Off resistance.

In addition, by controlling the On resistance by using the control transistor 2 in this 1T1R type configuration, variations in On resistance can be reduced.

It is to be noted that in the MIM (Metal Insulator Metal) structure contained in the resistance change element 1 of the present embodiment, that is, the structure of upper electrode 11/resistance change portion 18/lower electrode 14, layers adjacent to each other may be stacked in at least partially in their regions. In addition, it is needless to say that the lower electrode 14 and the upper electrode 11 may be replaced with each other in the present embodiment.

A method of manufacturing the resistance change nonvolatile memory device according to the second embodiment of the invention will next be described. FIG. 11A to FIG. 11H are cross-sectional views showing the manufacturing method of the resistance change nonvolatile memory device according to the second embodiment of the invention.

Figure 11A:
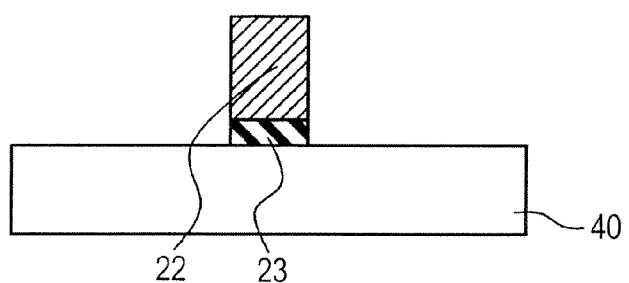
FIG. 11A is a cross-sectional view showing a method of manufacturing the resistance change nonvolatile memory device according to the second embodiment of the invention.
Figure 11B:
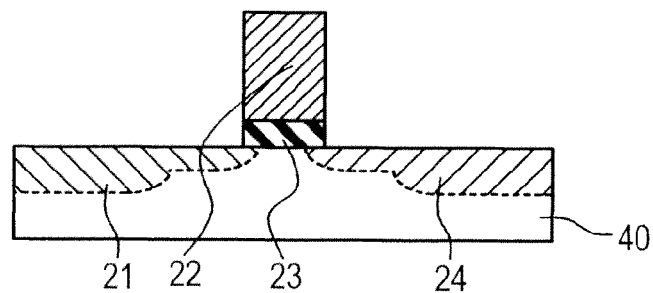
FIG. 11B is a cross-sectional view showing the method of manufacturing the resistance change nonvolatile memory device according to the second embodiment of the invention.
Figure 11C:
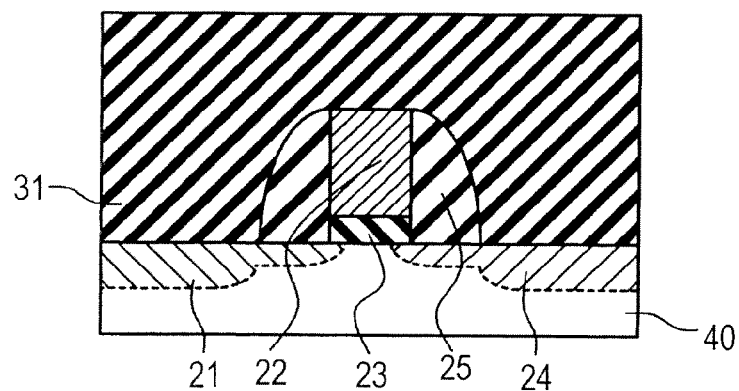
FIG. 11C is a cross-sectional view showing the method of manufacturing the resistance change nonvolatile memory device according to the second embodiment of the invention.
Figure 11D:
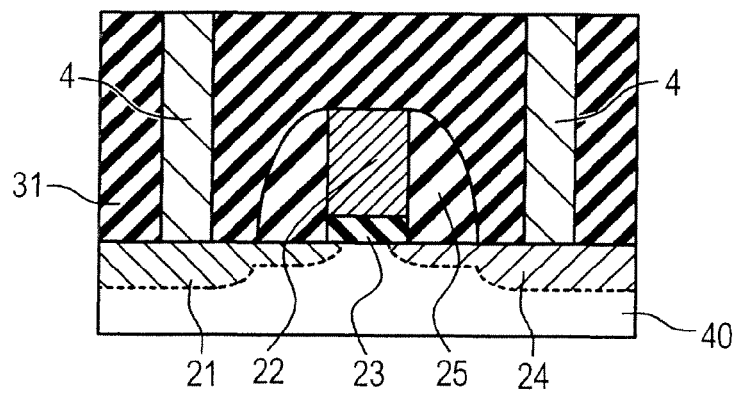
FIG. 11D is a cross-sectional view showing the method of manufacturing the resistance change nonvolatile memory device according to the second embodiment of the invention.

First, as illustrated in FIG. 11A, a silicon oxide film ($SiO_2$) and a phosphorus-added polysilicon film (P-doped Si) are deposited on a semiconductor substrate 40. An exposure step and a dry etching step are conducted to pattern these films to form a gate insulating film 23 and a gate 22. Next, as illustrated in FIG. 11B, phosphorus (P) is implanted at a dose of $2 \times 10^{+15}$ $cm^{-2}$ with the gate 22 as a mask to form a source 24 and a drain 21. Next, as shown in FIG. 11C, a first interlayer insulating film 31 is deposited on the entire surface of the semiconductor substrate 40, followed by planarization of the surface by using a CMP (Chemical Mechanical Etching) process. In the present embodiment, a silicon oxide film ($SiO_2$) is used as the first interlayer insulating film 31. Next, as shown in FIG. 11D, an exposure step and a dry etching step are employed to make a contact hole in the first interlayer insulating film 31 on the source 24 and the drain 21. Then, a titanium nitride film (TiN) and a tungsten film (W) are deposited. Then, a CMP process is employed to planarize the surface and at the same time, remove the titanium nitride film (TiN) and tungsten film (W) outside the contact holes to form contacts 4, respectively.

Figure 11E:
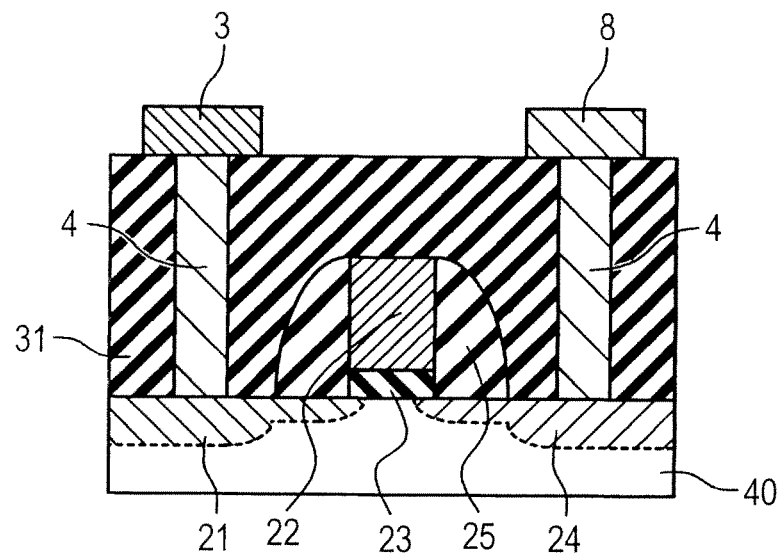
FIG. 11E is a cross-sectional view showing the method of manufacturing the resistance change nonvolatile memory device according to the second embodiment of the invention.
Figure 11F:
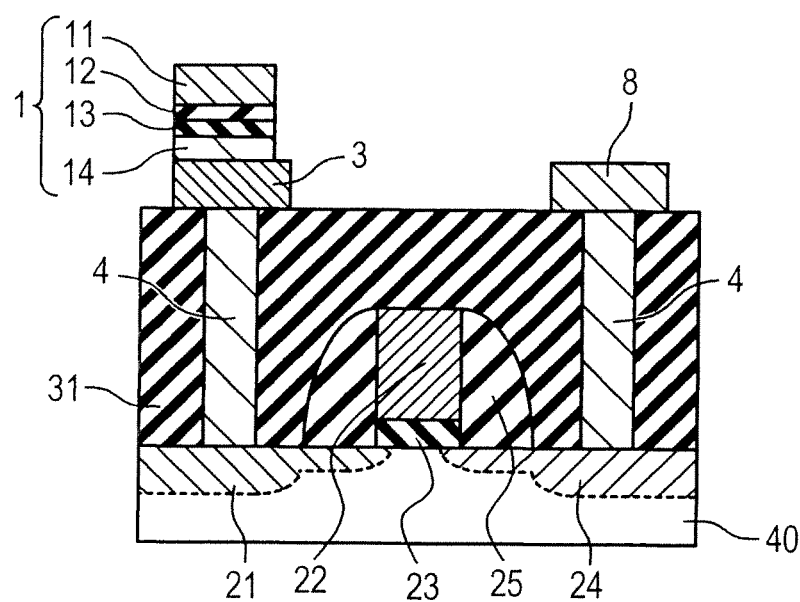
FIG. 11F is a cross-sectional view showing the method of manufacturing the resistance change nonvolatile memory device according to the second embodiment of the invention.

Next, as shown in FIG. 11E, a titanium nitride film (TiN) and an aluminum film (Al) are deposited successively to form a metal wiring layer. An exposure step and a dry etching step are conducted to pattern the layer to form a first wiring 3 and a common line 8 in a first-level wiring layer (Metal 1). Then, as shown in FIG. 11F, a ruthenium film (Ru) having a thickness of 10 nm is deposited. Next, a zirconium oxide film ($ZrO_2$) having a thickness of 0.8 nm and a tantalum oxide film ($Ta_2O_5$) having a thickness of 8 nm are deposited successively. For the formation of the zirconium oxide film ($ZrO_2$), an ALD (Atomic Layer Deposition) apparatus is employed. The film is formed at 140° C. by using as a raw material ZDEAZ (tetrakis(diethylamino)zirconium). The tantalum oxide film ($Ta_2O_5$) is formed using an RF sputter apparatus. As a sputter target, $Ta_2O_5$ is used and a chamber is fed with an oxygen gas and an argon gas at a rate of 10 sccm and 5 sccm, respectively. The film is formed at a temperature of 350° C. at a power of 2 kW. Further, a ruthenium film (Ru) with a thickness of 10 nm is deposited. Then, the film is patterned using an exposure step and a dry etching step to form, on the first wiring 3, a resistance change element 1 (ReRAM) having a lower electrode 14, a resistance change layer 13, a stable layer 12, and an upper electrode 11.

Figure 11G:
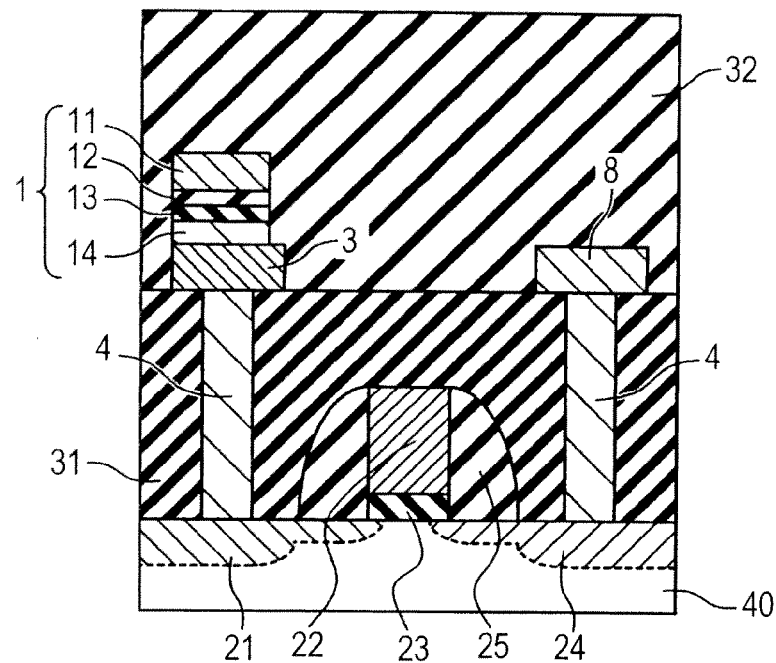
FIG. 11G is a cross-sectional view showing the method of manufacturing the resistance change nonvolatile memory device according to the second embodiment of the invention.
Figure 11H:
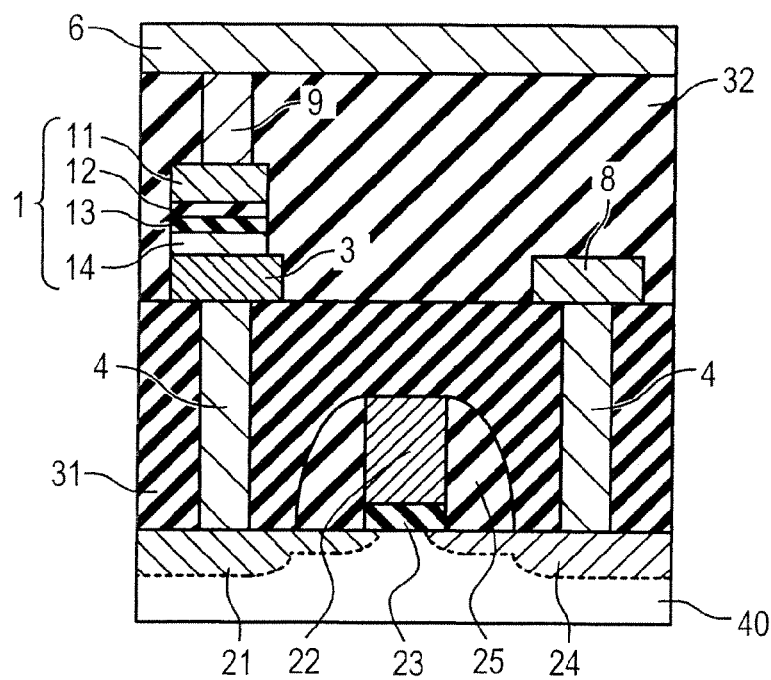
FIG. 11H is a cross-sectional view showing the method of manufacturing the resistance change nonvolatile memory device according to the second embodiment of the invention.

Next, as shown in FIG. 11G, a second interlayer insulating film 32 is deposited on the entire surface of the semiconductor substrate 40, followed by planarization by using CMP. In the present embodiment, a silicon oxide film ($SiO_2$) is used as the second interlayer insulating film 32. Next, as shown in FIG. 11H, a via hole is provided in the second interlayer insulating film 32 by using an exposure step and a dry etching step and a titanium nitride film (TiN) and a tungsten film (W) are deposited. Further, a CMP process is used to planarize the surface and at the same time, remove the titanium nitride film (TiN) and the tungsten film (W) other than those in the via hole to form a via 9. Next, a titanium nitride film (TiN) and an aluminum film (Al) are deposited successively to form a metal wiring layer. The metal wiring layer is patterned using an exposure step and a dry etching step to form a second wiring 6 in a second-level wiring layer (Metal 2).

Thus, the resistance change nonvolatile memory device according to the present embodiment is manufactured.

Figure 1B:
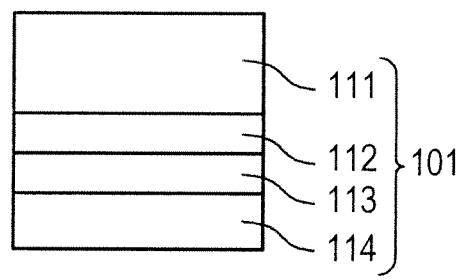
FIG. 1B is a cross-sectional view showing the configuration of a major portion of the resistance change memory proposed in Non-patent Document 2 or Non-patent Document 3.
Figure 2A:
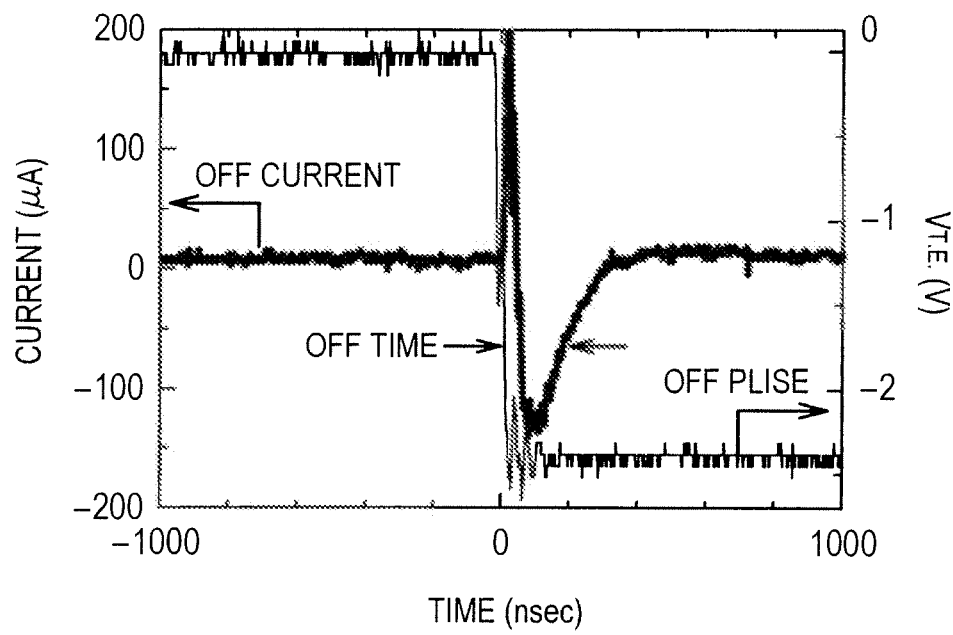
FIG. 2A is a graph showing the transient response of a switching current upon Reset operation when the structure of the resistance change memory shown in FIG. 1A is used.
Figure 2B:
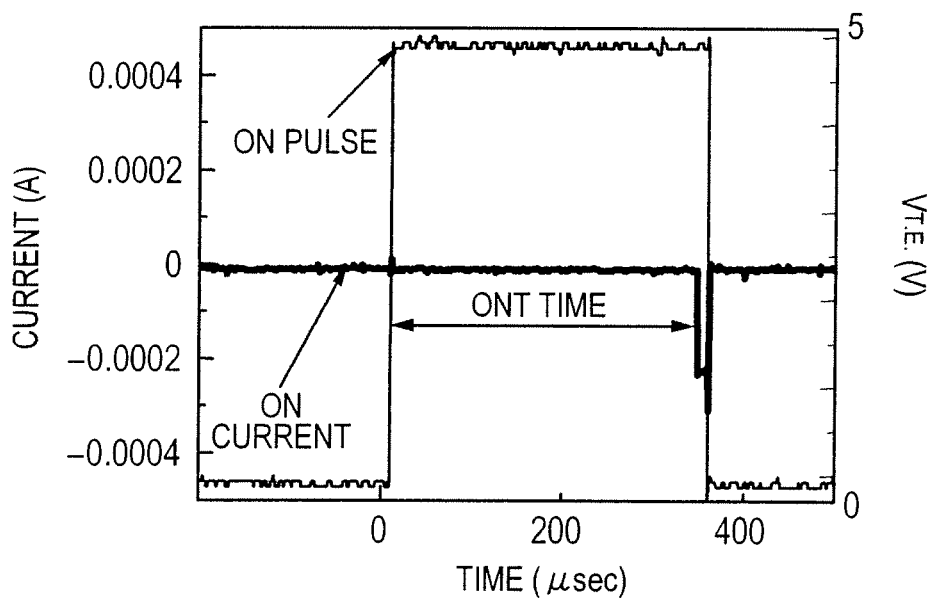
FIG. 2B is a graph showing the transient response of a switching current upon On operation when the structure of the resistance change memory shown in FIG. 1A is used.
Figure 2C:
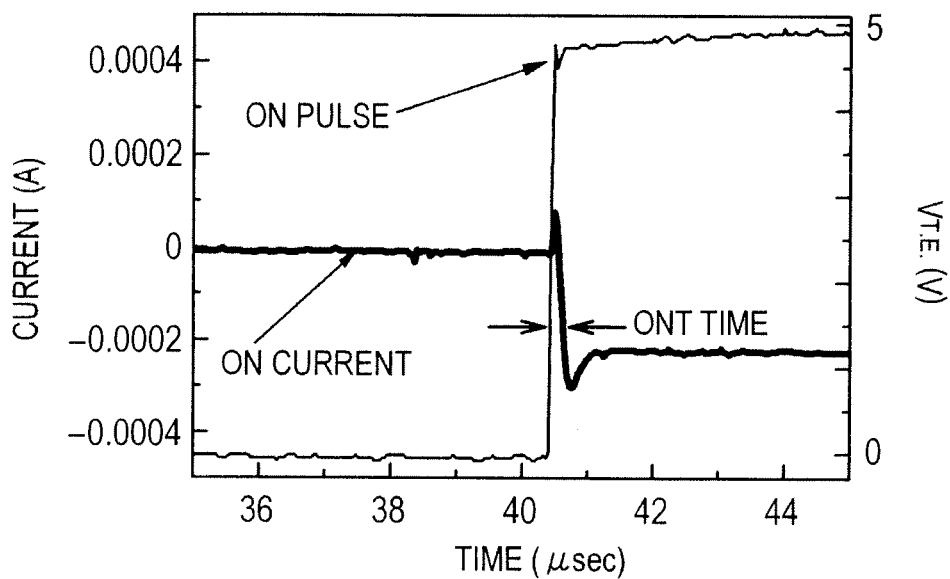
FIG. 2C is a graph showing the transient response of a switching current upon On operation when the structure of the resistance change memory shown in FIG. 1A is used.
Figure 3A:
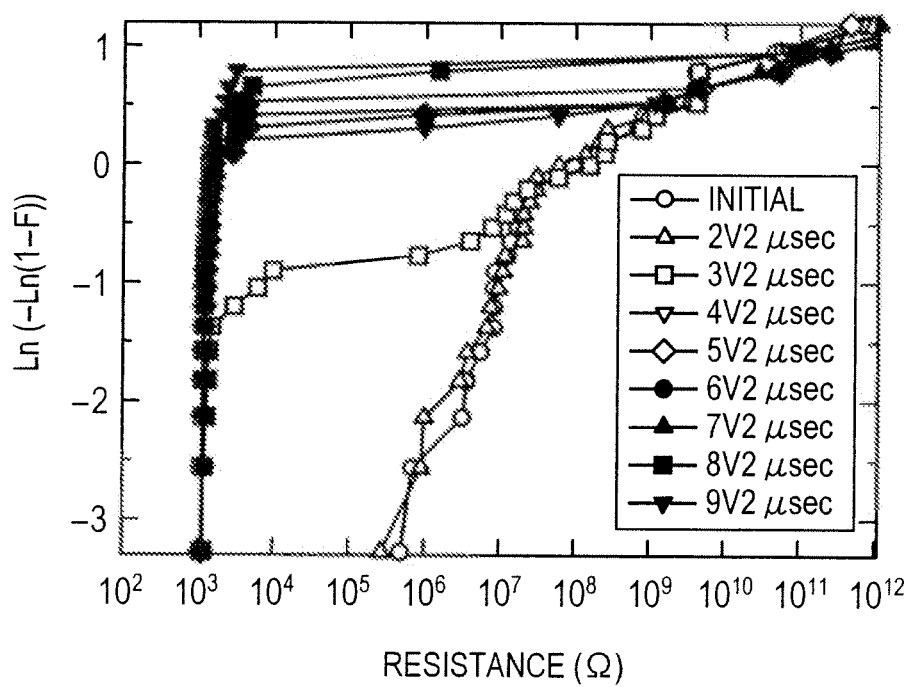
FIG. 3A is a graph (Weibull plot) showing a resistance distribution when On-voltage pulses of from 2V to 7V are applied to a plurality of samples in a high resistance state, respectively.
Figure 3B:
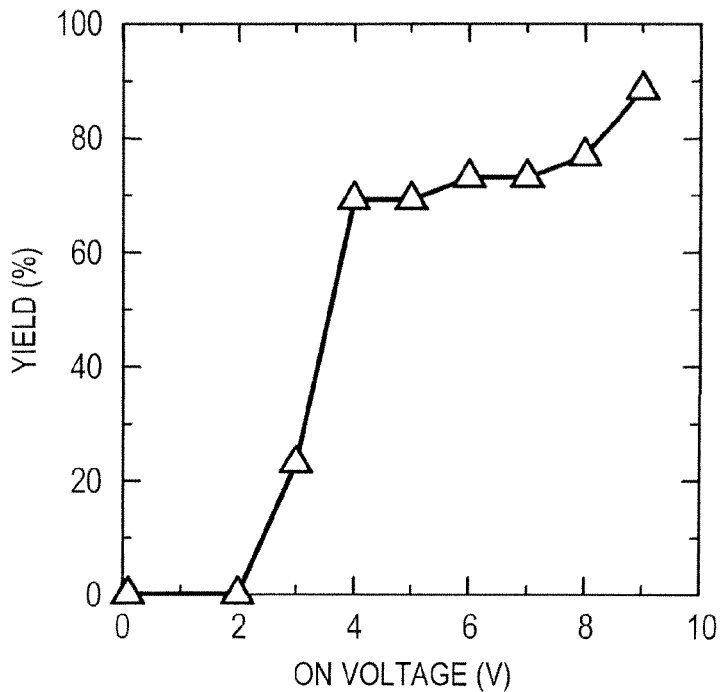
FIG. 3B is a graph showing an On-operation (resistance reduction) success rate in the case of FIG. 3A.
Figure 4:
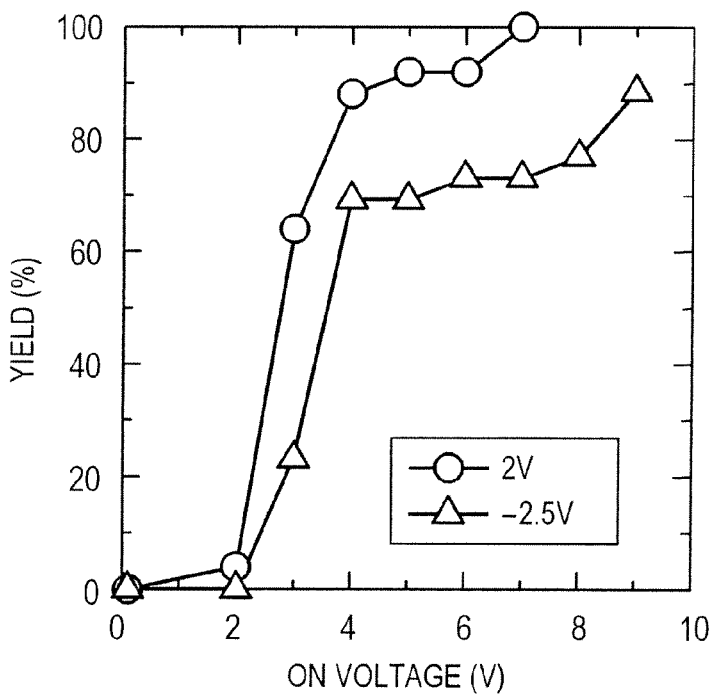
FIG. 4 shows Off-voltage dependence of an On-operation success rate.
Figure 5:
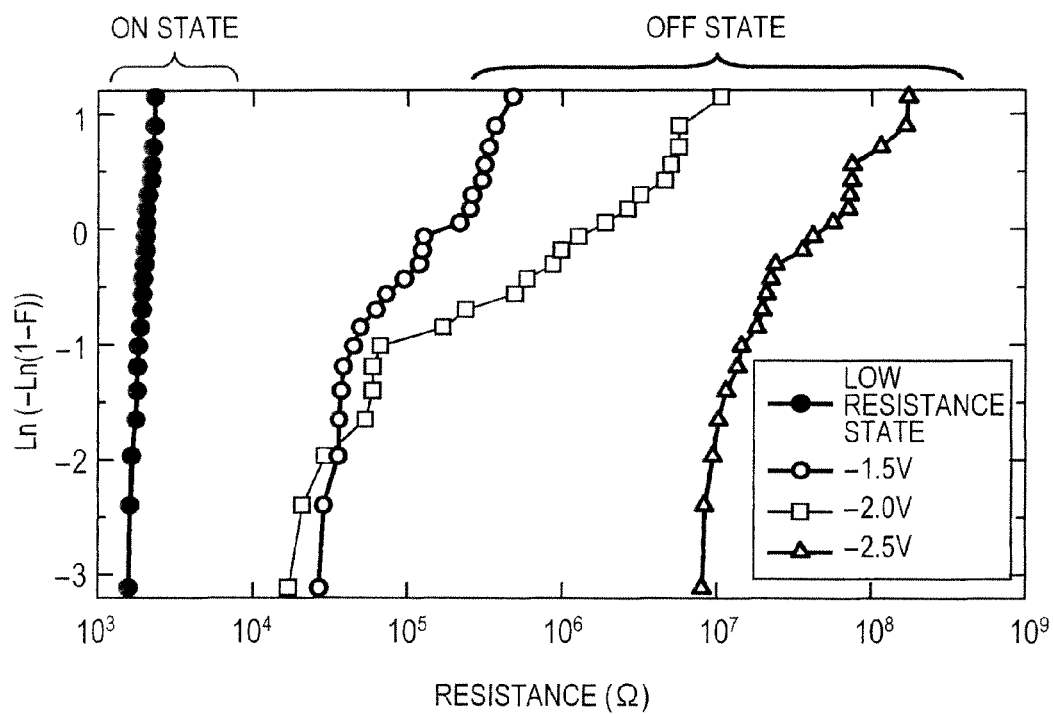
FIG. 5 shows Off-voltage dependence of an ON-state resistance distribution and an Off-state resistance distribution.
Figure 12:
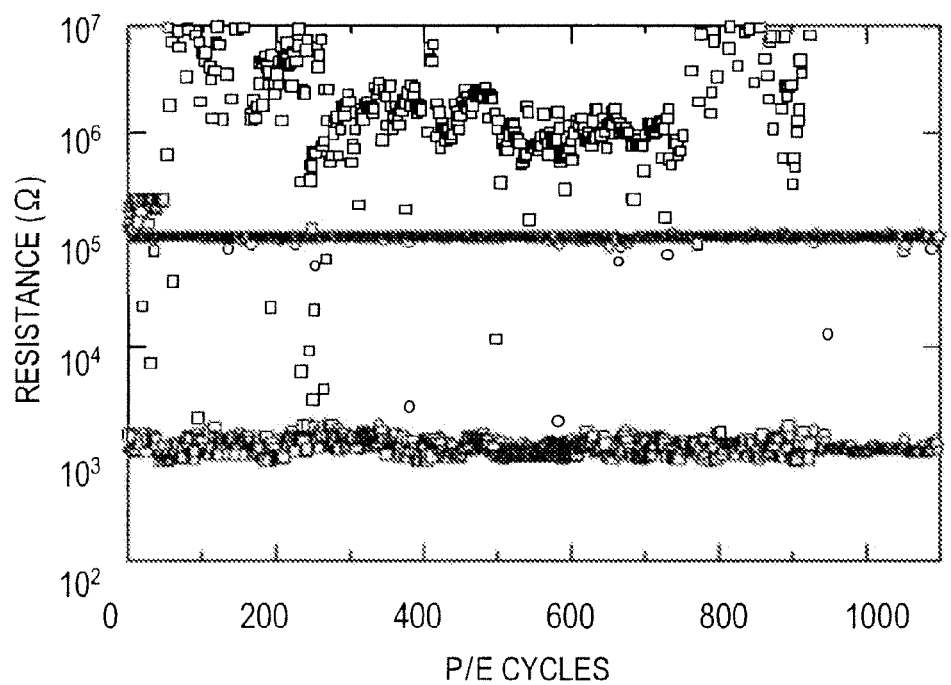
FIG. 12 is a graph showing the results of comparison, in a resistance change upon On/Off repetition, between the resistance change nonvolatile memory device according to the second embodiment of the invention and the resistance change nonvolatile memory device relating to FIG. 1A.

FIG. 12 is a graph showing the results of comparison, in resistance change upon On/Off repetition, between the resistance change nonvolatile memory device according to the second embodiment of the invention and the resistance change nonvolatile memory device relating to FIG. 1A. The resistance ($\Omega$) is plotted along the ordinate, while the number of P/E (Program/Erase) cycles, that is, the number of On/Off cycles is plotted along the abscissa. In this graph, an open circle shows the results of the configuration of the present embodiment and an open square shows the results of the configuration of FIG. 1A. The resistance change element of the present embodiment has the following configuration: Ru (10 nm)/TaOx (8 nm)/ZrOx (0.8 nm)/Ru (10 nm), while that of FIG. 1A has the following configuration: Ru (10 nm)/TaOx (8 nm)/TiOx (2 nm)/Ru (10 nm). Incidentally, verification of Off resistance upon Off operation was not conducted. Off voltage was fixed at −2.5V, On resistance was controlled by the transistor current of a control transistor coupled to the resistance change element.

As shown in FIG. 12, marked variations in Off resistance are observed from the results using the configuration of FIG. 1A, while almost no variations in Off resistance is observed from the results using the configuration of the present embodiment. This means that by using the structure of the resistance change element 1 of the present embodiment, it is possible to reduce variations in resistance upon On/Off repetition. In particular, since the formation of a tunnel barrier is self-limited by the resistance change layer 13 ($ZrO_x$ film), variations in Off resistance can be reduced significantly. In addition, the present embodiment also produces other advantages of the first embodiment.

Third Embodiment

The configuration of a resistance change nonvolatile memory device according to a third embodiment of the invention will be described referring to accompanying drawings. The third embodiment relates to a semiconductor device having therein the resistance change element according to the first embodiment as a switching element in an FPGA (Field Programmable Gate Array) region, the 1T1R type resistance change memory according to the second embodiment as a nonvolatile memory in a memory region, and a logic LSI (large-scale integration) in a logic region. The device will next be described in detail.

Figure 13:
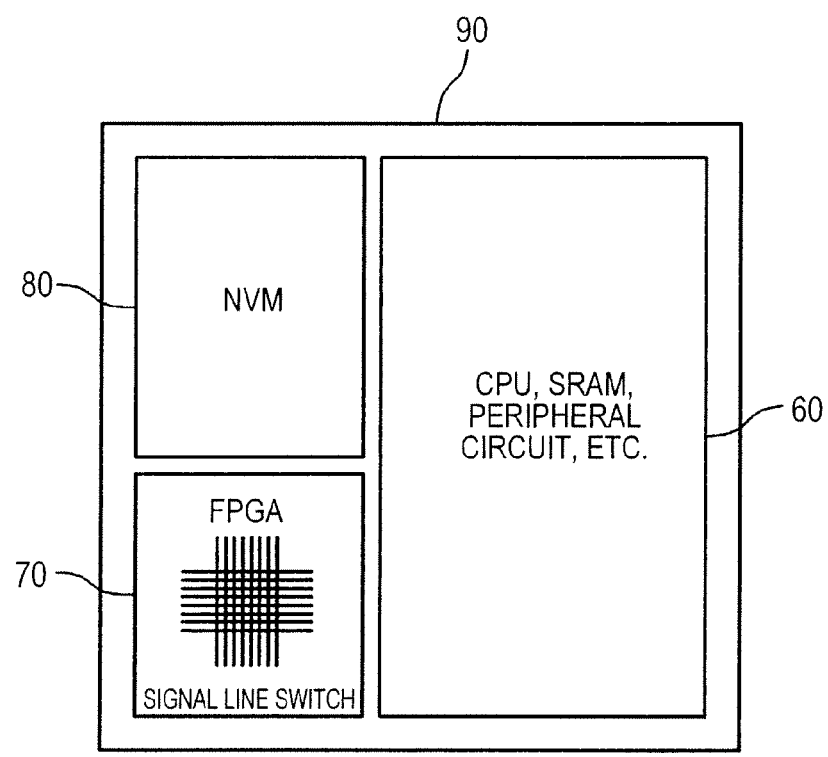
FIG. 13 is a block diagram showing one example of the configuration of a semiconductor device according to a third embodiment of the invention.

FIG. 13 is a block diagram showing one example of the configuration of the semiconductor device according to the third embodiment of the invention. A semiconductor device 90 is equipped with a logic portion 60, an FPGA portion 70, and a memory portion 80. The logic portion 60 has a function as a logic LSI and is equipped with logic circuits such as CPU (Central Processing Unit) and SRAM (Static Random Access Memory), a memory, and the like. The configuration of the logic portion 60 is not particularly limited. The FPGA portion 70 has a function as a field programmable gate array (FPGA) and is equipped with a plurality of the resistance change elements 1 according to the first embodiment as a switching element of the FPGA. The FPGA portion 70 can reconfigure a logic circuit by the On state/Off state settings of the plurality of the resistance change elements 1. The memory portion 80 has a function as a nonvolatile memory and is equipped with a plurality of 1T1R type resistance change memories (each having the resistance change element 1 and the control transistors 2) as the memory cell of a nonvolatile memory. The logic portion 60, the FPGA portion 70, and the memory portion 80 are coupled to each other to allow input and output of data. The logic portion 60 controls the behaviors of the FPGA portion 70 and the memory portion 80. The FPGA portion 70 may control the behavior of the logic portion 60 or the memory portion 80. The layout of the logic portion 60, the FPGA portion 70, and the memory portion 80 in this block diagram is only one example and it is not limited by this example.

Figure 14:
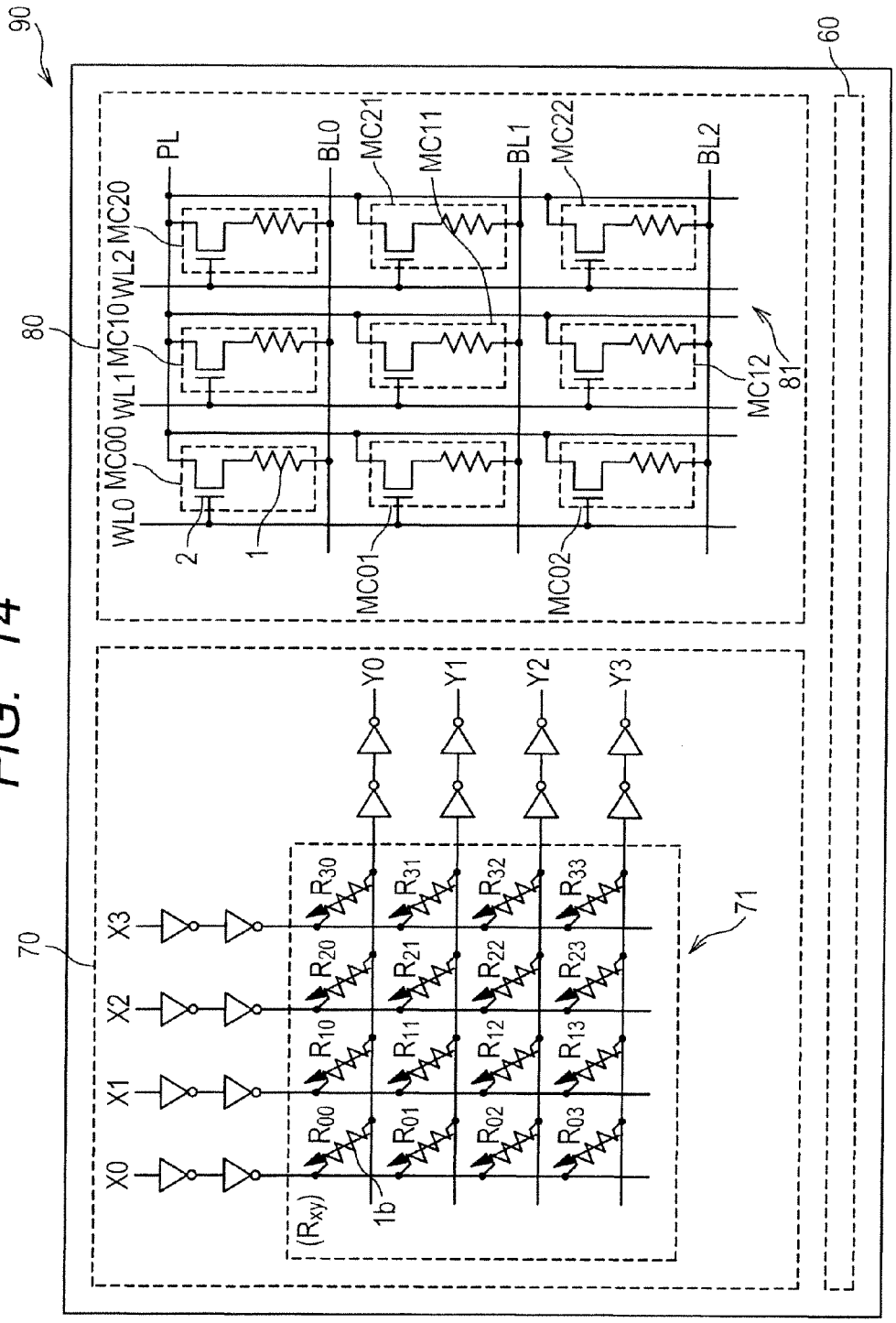
FIG. 14 is a schematic view showing one example of the configuration of the FPGA portion and the memory portion of the semiconductor device shown in FIG. 13.

FIG. 14 is a schematic view showing one example of the respective configurations of the FPGA portion 70 and the memory portion 80 in the semiconductor device of FIG. 13. As already described above, no particular limitation is imposed on the configuration of the logic portion 60 so that it is omitted from the drawing.

The FPGA portion 70 is equipped with a plurality of signal lines Xi (i=from 0 to n, i and n each an integer, in this drawing, i represents up to 3), a plurality of signal lines Yj (j=from 0 to m, j and m each an integer, in this drawing, j represents up to 3), and a plurality of resistance change elements Rij (in this drawing, indicated up to R33). Signal lines Xi (i=from 0 to n) are input single lines extending in a first direction. Signal lines Yj (j=from 0 to m) are output signal lines extending in a second direction perpendicular to the first direction. Resistance change elements Rij (i=from 0 to n, j=from 0 to m) are provided at positions corresponding to intersections where signal lines Xi (i=from 0 to n) and signal lines Yj (j=from 0 to m) intersect each other and they are arranged in a matrix form. One of the electrodes of each of resistance change elements Rij is coupled to the corresponding signal line Xi and the other electrode is coupled to the corresponding signal line Yj. Each resistance change element Rij is set at in an On state or in an Off state by a voltage applied to a signal line Xi and a signal line Yj. When a resistance change element Rij is in an On state, that is, in a low resistance state, a signal supplied from a signal line Xi is supplied to a signal line Yj. On the other hand, when a resistance change element Rij is an Off state, that is, in a high resistance state, a signal supplied from a signal line Xi is not supplied to a signal line Yj. In such a manner, each resistance change element Rij functions as a switching element. Accordingly, a plurality of resistance change elements Rij (i=from 0 to n, j=from 0 to m) configures a crossbar switch 71 as a switch block in FPGA (switch matrix). Another configuration of FPGA is similar to that of a related-art one so that description on it is omitted.

The memory portion 80 is equipped with a plurality of word lines WLk (k=from 0 to p, k and p, each an integer, in this drawing, k represents up to 2), a plurality of bit lines BL1 (l=from 0 to q, l and q, each an integer, in this drawing, l represents up to 2), a plurality of memory cells MCkl (indicated up to MC22 in the drawing), and a common line PL. Word lines WLk (k=from 0 to p) extend in the first direction. Bit lines BL1 (l=from 0 to q) extend in a second direction perpendicular to the first direction. Memory cells MCkl (k=from 0 to p, l=from 0 to q) are provided at positions corresponding to the intersections where word lines WLk (k=from 0 to p) and bit lines BL1 (l=from 0 to q) intersect each other and they are arranged in a matrix form. The common line PL is branched and coupled to each memory cell MCkl. Memory cells MCkl are each equipped with a resistance change element 1 and a control transistor 2. The gate of the control transistor 2 is coupled to the corresponding word line WLk, one of the source/drain is coupled to the common line PL, and the other one of the source/drain is coupled to one of the electrodes of the resistance change element 1. The other electrode of the resistance change element 1 is coupled to the corresponding bit line BL1. The resistance change element 1 of each of memory cells MCkl is set at in an On state or in an Off state by a voltage applied to a word line WLk and a bit line BL1. Memory cells MCkl (k=from 0 to p, l=from 0 to q) constitute a memory array 81 in the 1T1R type resistance change memory. The configuration of the other portion of the resistance change memory is similar to that of a related-art one so that a description on it is omitted.

Figures 15, 16A, 16B:
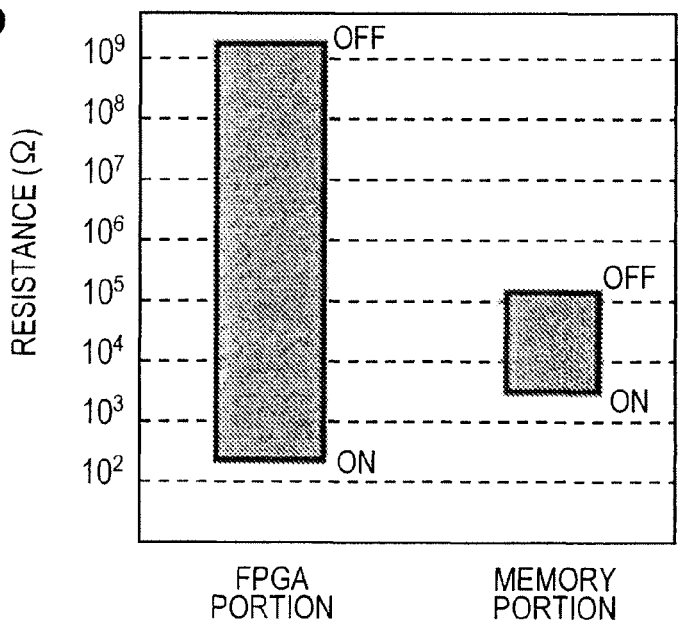
FIG. 15 is a graph showing the resistance of the FPGA portion and the memory portion in an On state and an Off state of the resistance change element.
FIG. 16A shows an example of the configuration of a crossbar switch in the FPGA portion of FIG. 14.
FIG. 16B shows an example of the configuration of a crossbar switch in the FPGA portion of FIG. 14.

FIG. 15 is a graph showing the resistance of the resistance change element of the FPGA portion 70 and the memory portion 80 in an On state and an Off state. The FPGA portion 70 and the memory portion 80 are plotted along the abscissa and the resistance (Ω) of the resistance change element is plotted along the ordinate. A resistance change element (Rij) used in the FPGA portion 70 is required to permit passage of a signal in an On state and not permit passage of a signal in an Off state. The resistance in an On state is therefore set at a relatively low value and the resistance in an Off state is set at a relatively high value. In the example shown in this drawing, the resistance in an On state is set at about $10^2 \Omega$ and the resistance in an Off state is set at about $10^9 \Omega$. In order to set the resistance at a relatively high value, the thickness of the resistance change layer 13 may be increased in the resistance change element of the first embodiment. This increases variations in resistance, but causes no problem if the resistance has a predetermined value or greater. On the other hand, in the resistance change element 1 used in the memory portion 80, the resistance in an Off state is set at a relatively low value and the resistance in an On state is set at a relatively high value in order to achieve high-speed and stable reading as described above. In the example shown in this graph, the resistance in an On state is set at about $10^3 \Omega$ and the resistance in an Off state is set at about $10^5 \Omega$. Details are as described in the first and second embodiments.

FIG. 16A and FIG. 16B show configuration examples of the crossbar switch 71 of the FPGA portion 70 in FIG. 14. In FIG. 16A and FIG. 16B, x and y correspond to the column (number) and the row (number) of the crossbar switch 71, respectively. Described specifically, the column x=i and the row y=j indicate the state (On state/Off state) of the resistance change element Rij corresponding to them. The number "1" represents an On state and the number "0" represents an Off state. For example, the column x=0 and the row y=0 indicate the state of a resistance change element R00. In the case of FIG. 16A, for example, the resistance change element R00 is "1" so that it is in an On state. Only resistance change elements R00, R11, R22, and R33 show "1", meaning that they are "in an On state" so that signals of signal lines X0, X1, X2, and X3 are output from Y0, Y1, Y2, and Y3, respectively. On the other hand, in the case of FIG. 16B, only resistance change elements R03, R12, R21, and R30 show "1", meaning that they are "in an On state" so that signals of signal lines X0, X1, X2, and X3 are output from signal lines Y3, Y2, Y1, and Y0, respectively.

Figure 17A:
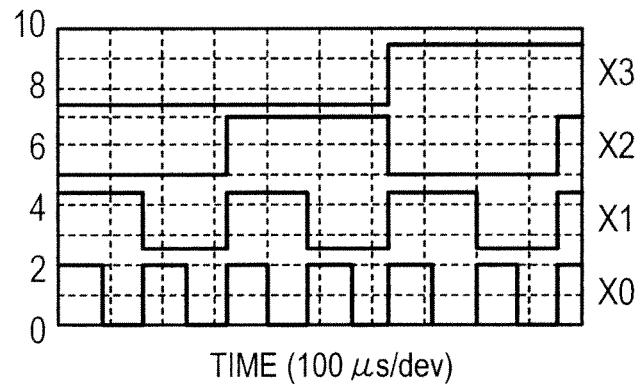
FIG. 17A is a graph showing an example of the behavior of the crossbar switch of the FPGA portion.
Figure 17B:
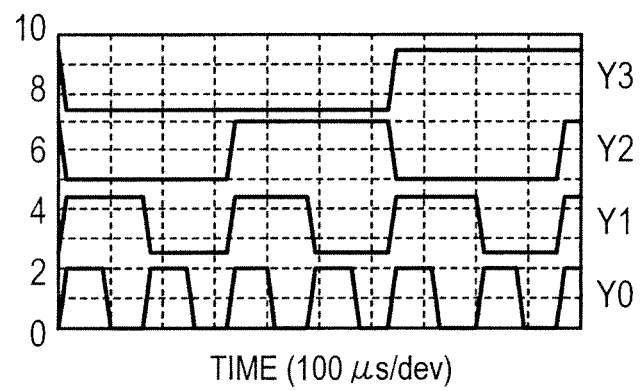
FIG. 17B is a graph showing an example of the behavior of the crossbar switch of the FPGA portion.
Figure 17C:
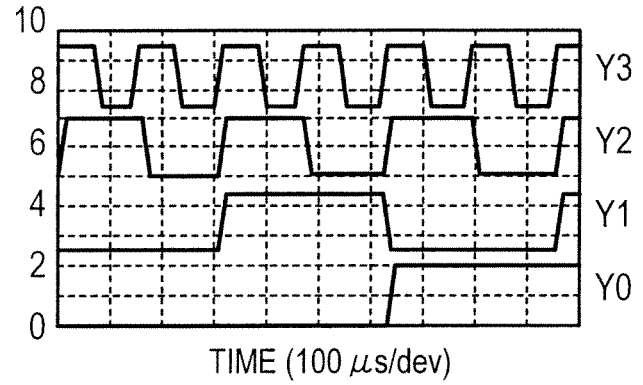
FIG. 17C is a graph showing an example of the behavior of the crossbar switch of the FPGA portion.

FIG. 17A to FIG. 17C are graphs showing examples of the behavior of the crossbar switch 71 of the FPGA portion 70. FIG. 17A shows an input signal. FIG. 17B shows an output signal when the crossbar switch 71 has the configuration of FIG. 16A. FIG. 17C shows an output signal when the crossbar switch 71 has the configuration of FIG. 16B. In each graph, the strength of signals different in kind is plotted along the ordinate and time (100 μs/dev) is plotted along the abscissa. When input signals as shown in FIG. 17A are input to signal lines X0 to X3, output signals as shown in FIG. 17B are output to signal lines Y0 to Y3 in the case of the configuration of FIG. 16A. On the other hand, when input signals as shown in FIG. 17A are input to signal lines X0 to X3, output signals as shown in FIG. 17C are output to signal lines Y0 to Y3.

Figure 18B:
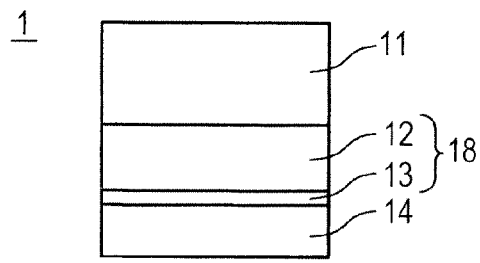
FIG. 18B is a cross-sectional view showing one example of the configuration of the semiconductor device according to the third embodiment of the invention.
Figure 18C:
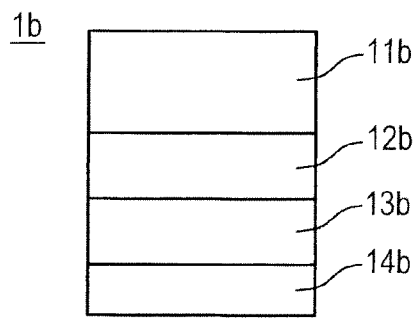
FIG. 18C is a cross-sectional view showing one example of the configuration of the semiconductor device according to the third embodiment of the invention.

FIG. 18A to FIG. 18C are cross-sectional views showing one example of the configuration of the semiconductor device according to the third embodiment of the invention. In FIG. 18A, however, the logic portion 60, the FPGA portion 70, and the memory portion 80 shown in FIG. 14 is shown as one element to facilitate understanding. Described specifically, one of transistors 2a to be used in the logic circuit is shown in the logic portion 60; one of resistance change elements 1b (Rij) to be used for the crossbar switch 71 is shown in the FGPA portion 70; and one of memory cells (MC) to be used for the memory array 81 is shown in the memory portion 80. FIG. 18B shows the resistance change element 1 of the memory array 81 and FIG. 18C shows the resistance change element 1b of the crossbar switch 71.

The memory cell (MC) of the memory portion 80 is a 1T1R type and is equipped with a control transistor 2 and a resistance change element 1 (FIG. 18A). Details of it are similar to those of the second embodiment. Described specifically, the resistance change element 1 has a stacked structure obtained by sandwiching a stable layer 12 and a resistance change layer 13 between an upper electrode 11 and a lower electrode 14 (FIG. 18B). The stable layer 12 and the resistance change layer 13 have film thicknesses of, for example, 8 nm and 0.8 nm, respectively. The control transistor 2 of the memory cell is formed in a surface region of a conductor substrate 40 isolated from another region by an element isolation layer 41. The control transistor 2 is equipped with a gate insulating film 23, a gate 22 (word line WL), a drain 21, a source 24, and a sidewall 25. Contacts 4 are coupled onto the drain 21 and the source 24, respectively. The control transistor 2 and each of the contacts 4 are covered with a first interlayer insulating film 31. The contact 4 on the side of the drain 21 is coupled to a first wiring 3 of a first-level wiring layer (Metal 1). The resistance change element 1 is provided on the first wiring 3 and coupled to the first wiring 3. A via 9 is coupled onto the resistance change element 1. The via 9 is coupled to a second wiring 6 (bit line BL) on a second-level wiring layer (Metal 2). On the other hand, the contact 4 on the side of the source 24 is coupled to a common line 8 (PL). The first wiring 3, the resistance change element 1, the via 9, and the common line 8 are covered with a second interlayer insulating film 32. The control transistor 2 of the memory portion 80 has a breakdown voltage higher than that of a transistor 2a of the logic portion 60 from the standpoint of a voltage applied thereto or a current flowing therethrough. For example, the thickness of the gate insulating film 23 is greater than that of the gate insulating film 23a.

The crossbar switch 71 of the FPGA portion 70 is equipped with a resistance change element 1b (Rij) (FIG. 18A). The resistance change element 1b has a stacked structure obtained by sandwiching a stable layer 12b and a resistance change layer 13b between an upper electrode 11b and a lower electrode 14b (FIG. 18O). The stable layer 12b and the resistance change layer 13b have film thicknesses of, for example, 8 nm and 8 nm, respectively. The first wiring 3b as a signal line Xi is formed in the first-level wiring layer (Metal 1). The resistance change element 1b is provided on the first wiring 3b and coupled to the first wiring 3b. A via 9b is coupled onto the resistance change element 1b. The via 9b is coupled to a second wiring 6b as a signal line Yj on the second-level wiring layer (Metal 2).

The transistor 2a of the logic portion 60 is formed in the surface region of a conductor substrate 40 isolated from another region by an element isolation layer 41. The transistor 2a is equipped with a gate insulating film 23a, a gate 22a, a drain 21a, a source 24a, and a sidewall 25a. Contacts 4a are coupled onto the drain 21a and the source 24a, respectively.

The transistors 2a and the contacts 4a are covered with the first interlayer insulating film 31. The contacts 4a are coupled to first wirings 3a of the first-level wiring layer (Metal 1), respectively. A via 9a is coupled onto the first wiring 3a. The via 9a is coupled to a second wiring 6a on the second-level wiring layer (Metal 2). The first wiring 3a and the via 9a are covered with the second interlayer insulating film 32.

Figure 19:
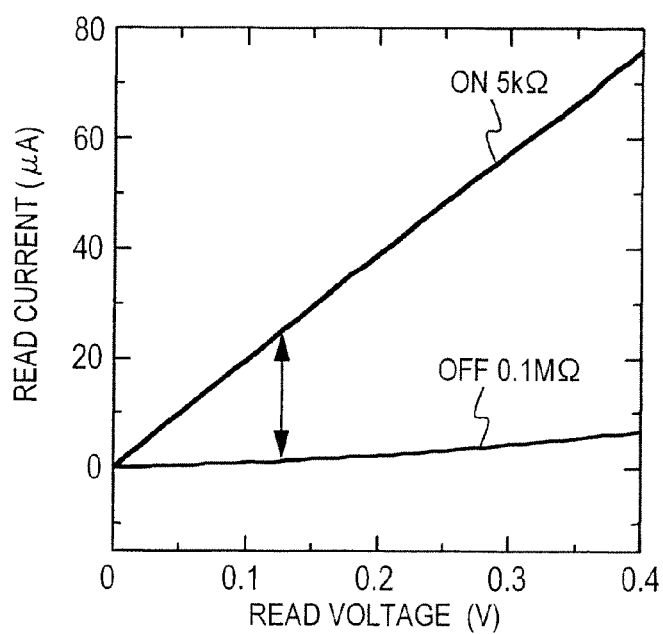
FIG. 19 is a graph showing one example of the relationship between a read current and a read voltage of the resistance change element in the memory portion of FIG. 18.

FIG. 19 is a graph showing one example of the relationship between a read current and a read voltage of the resistance change element 1 in the memory portion 80 of FIG. 18. A read voltage (V) is plotted along the abscissa and a read current (μA) is plotted along the ordinate. In this case, a resistance in an On state (On resistance) is 5 kΩ and a resistance in an Off state (Off resistance) is 0.1 MΩ. For example, currents of 20 μA and almost 0 μA can be obtained in an On state and in an Off state, respectively, by a read voltage of about 0.1V.

Next, a method of manufacturing the semiconductor device according to the third embodiment of the invention will be described. FIG. 20A to FIG. 20G are cross-sectional views showing the manufacturing method of the semiconductor device of the third embodiment of the present invention.

Figure 20B:
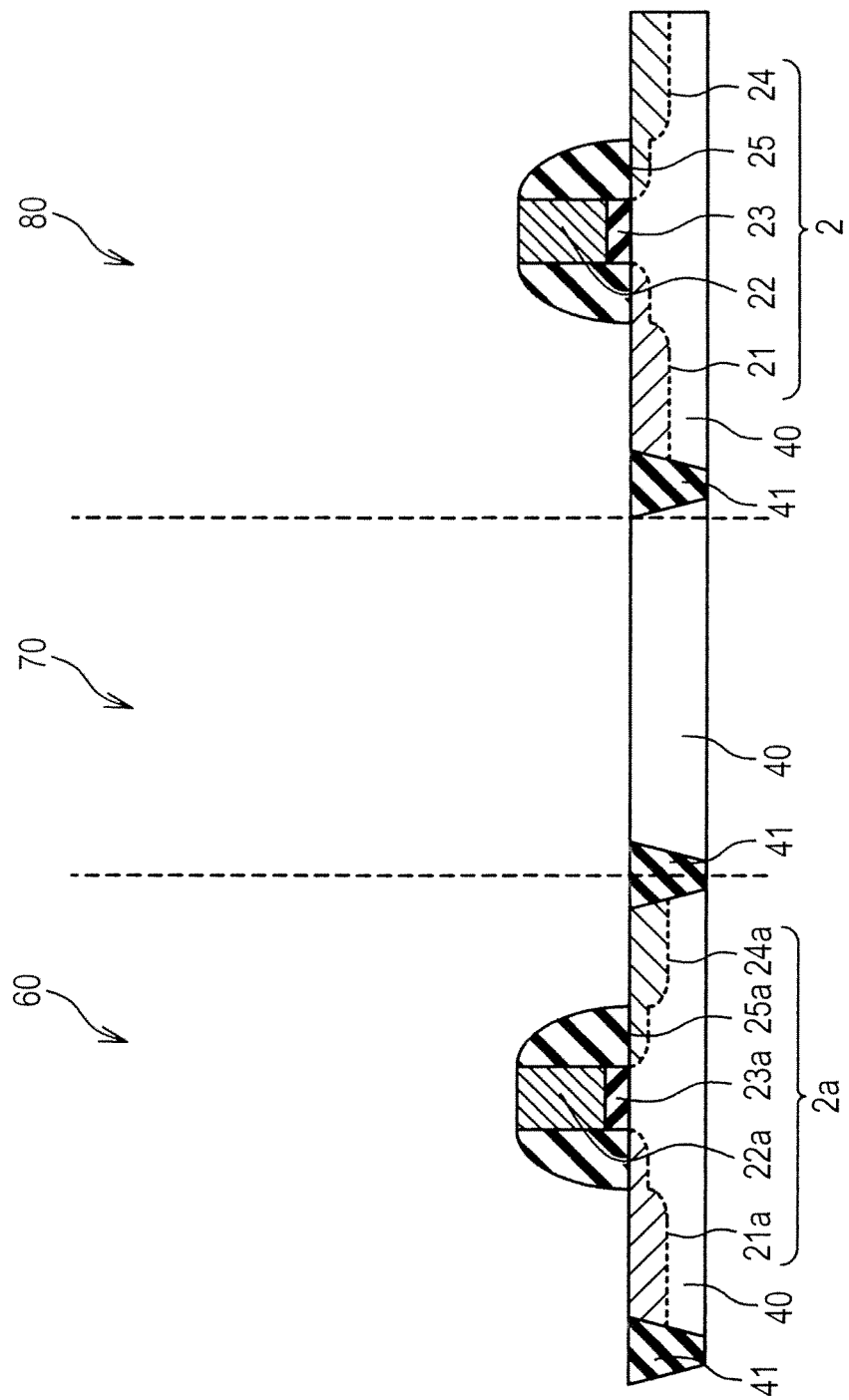
FIG. 20B is a cross-sectional view showing the method of manufacturing the semiconductor device according to the third embodiment of the invention.

As shown in FIG. 20A, an element isolation layer 41 is formed on a semiconductor substrate 40 by using a typical step. Then, in a memory portion 80 and a logic portion 60, a silicon oxide film ($SiO_2$) and a phosphorus-added polysilicon film (P-doped Si) are deposited on the semiconductor substrate 40. An exposure step and a dry etching step are used to pattern these films to form gate insulating films 23 and 23a and gates 22 and 22a. Next, as illustrated in FIG. 20B, phosphorus (P) is implanted at a dose of $2 \times 10^{+15}$ $cm^{-2}$ with the gates 22 and 22a as a mask to form sources 24 and 24a and drains 21 and 21a, respectively. Next, as shown in FIG. 20C, a first interlayer insulating film 31 is deposited on the entire surface of the semiconductor substrate 40, followed by planarization of the surface by using a CMP (Chemical Mechanical Polishing) process. In the present embodiment, a silicon oxide film ($SiO_2$) is used as the first interlayer insulating film 31. Next, in the memory portion 80 and the logic portion 60, an exposure step and a dry etching step are employed to make contact holes in the first interlayer insulating film 31 on the sources 24 and 24a and the drains 21 and 21a. Then, a titanium nitride film (TiN) and a tungsten film (W) are deposited. A CMP process is employed to planarize the surface and at the same time, the titanium nitride film (TiN) and the tungsten film (W) outside the contact holes are removed to form the contacts 4 and 4a. Furthermore, a titanium nitride film (TiN) and an aluminum film (Al) are deposited successively to form a metal wiring layer. Then, the metal wiring layer is patterned by using an exposure step and a dry etching step. As a result, a first wiring 3 and a common wiring 8 are formed in a first-level wiring (Metal 2) in the memory portion 80; a first wiring 3a is formed in the first-level wiring layer (Metal 1) in the logic portion 60; and a first wiring 3b is formed in the first-level wiring layer (Metal 1) in the FPGA portion 70.

Figure 20D:
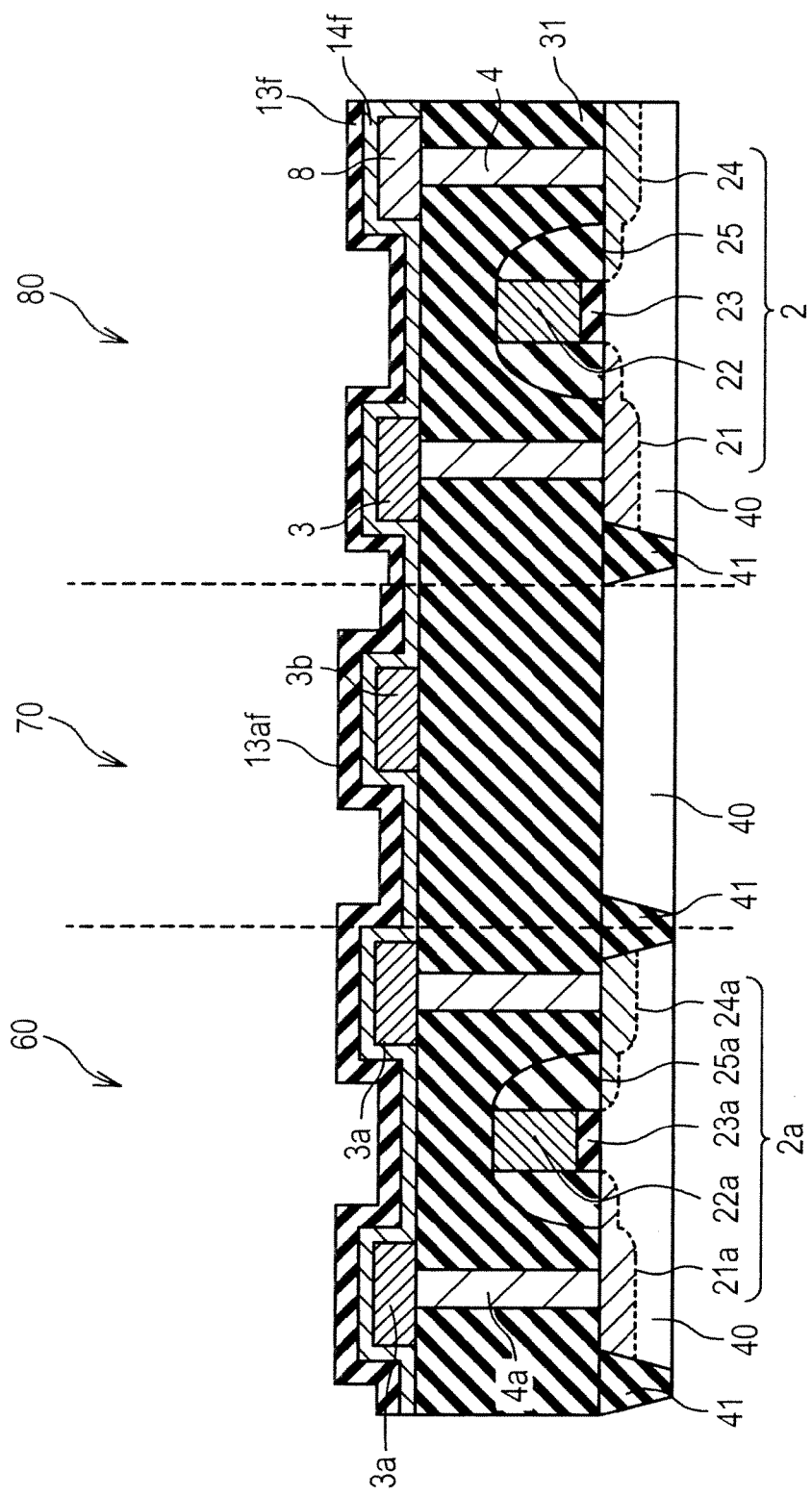
FIG. 20D is a cross-sectional view showing the method of manufacturing the semiconductor device according to the third embodiment of the invention.
Figure 20E:
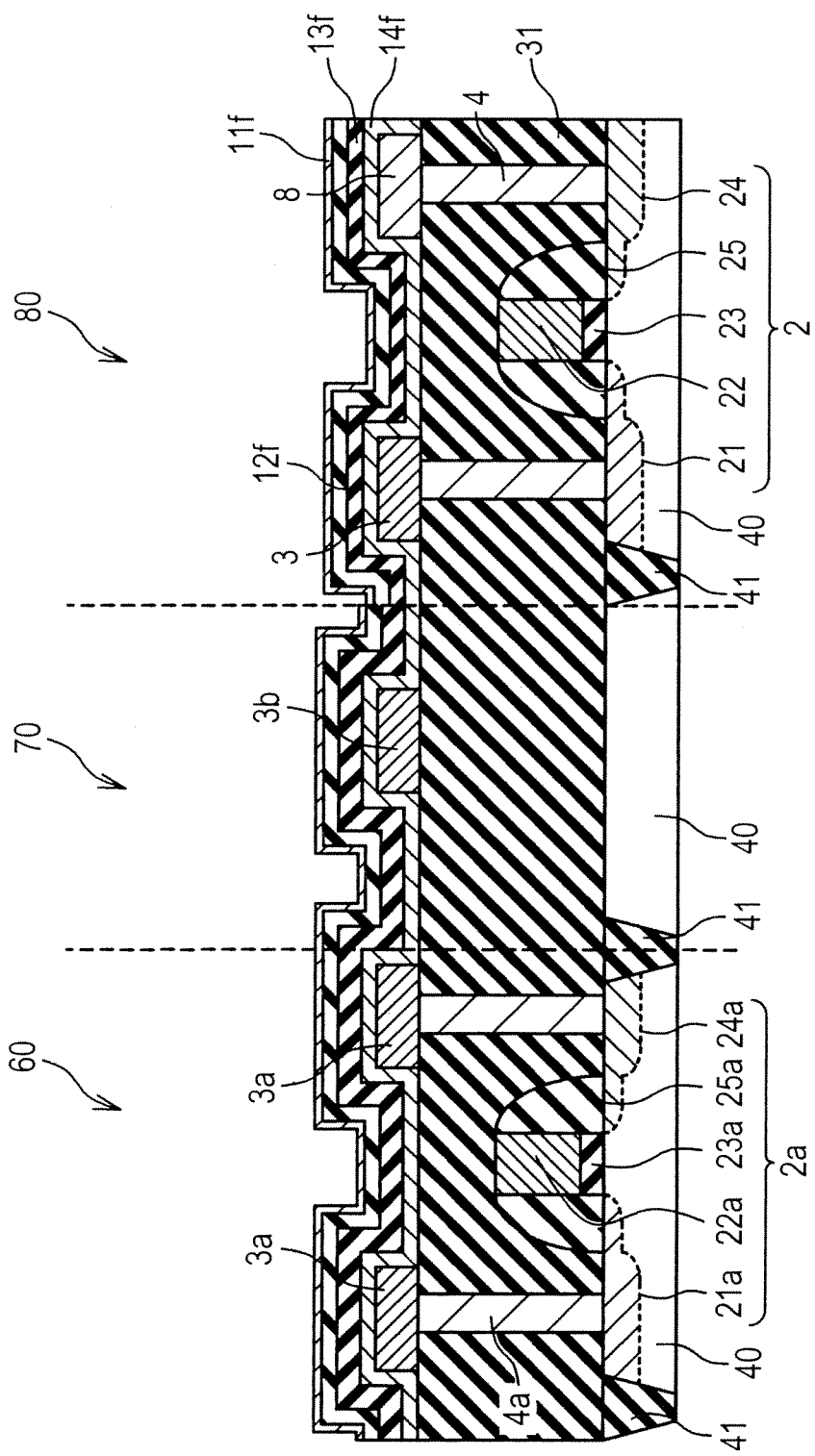
FIG. 20E is a cross-sectional view showing the method of manufacturing the semiconductor device according to the third embodiment of the invention.

Then, as shown in FIG. 20D, a ruthenium film (Ru) 14f having a thickness of 10 nm is deposited on the entire surface of the semiconductor substrate 40. Then, the logic portion 60 and the FPGA portion 70 are covered with a resist and a zirconium oxide film ($ZrO_2$) 13f having a film thickness of 0.8 nm is deposited on the memory portion 80. The resist is then removed. On the other hand, the memory portion 80 is covered with a resist and a zirconium oxide film ($ZrO_2$) 13af having a film thickness of 8 nm is deposited on the logic portion 60 and the FPGA portion 70. The resist is then removed. The zirconium oxide film ($ZrO_2$) is formed using an ALD (Atomic Layer Deposition) apparatus. The film is formed at 140° C. while using as a raw material ZDEAZ (tetrakis(diethylamino)zirconium). Then, as shown in FIG. 20E, a tantalum oxide film ($Ta_2O_5$) 12f having a film thickness of 8 nm is deposited on the entire surface of the semiconductor substrate 40. The tantalum oxide film ($Ta_2O_5$) is formed using an RF sputtering apparatus. The film is formed using as a sputter target $Ta_2O_5$ while feeding the chamber with an oxygen gas and an argon gas at 10 sccm and 5 sccm, respectively. The film is formed at a temperature of 350° C. with a power of 2 kW. Further, a ruthenium film (Ru) 11f having a film thickness of 10 nm is deposited on the entire surface of the semiconductor substrate 40. Then, as shown in FIG. 20F, patterning is conducted using an exposure step and a dry etching step to form a resistance change element 1 comprised of a lower electrode 14, a resistance change layer 13, a stable layer 12, and an upper electrode 11 on the first wiring 3 of the memory portion 80; and a resistance change element 1b comprised of a lower electrode 14b, a resistance change layer 13b, a stable layer 12b, and an upper electrode 11b on the first wiring 3b of the FPGA portion 70.

Figure 20G:
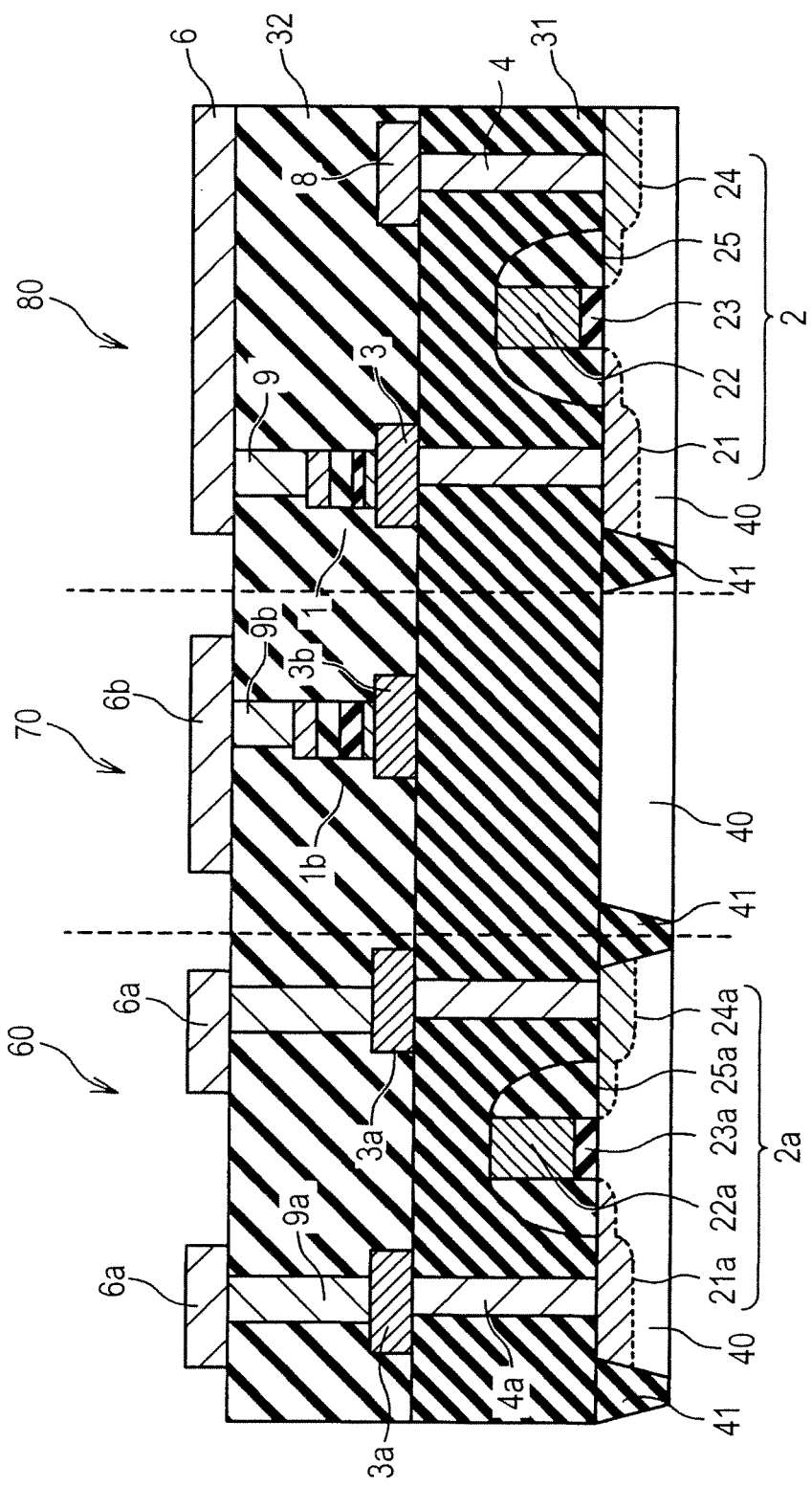
FIG. 20G is a cross-sectional view showing the method of manufacturing the semiconductor device according to the second embodiment of the invention.

Next, as shown in FIG. 20G, a second interlayer insulating film 32 is deposited on the entire surface of the semiconductor substrate 40 and the surface is planarized using a CMP process. In the present embodiment, a silicon oxide film ($SiO_2$) is used as the second interlayer insulating film 32. Then, a via hole is provided on the common line 8, the upper electrode 11, the upper electrode 11b, and the first wiring 3a in the second interlayer insulating film 32 by using an exposure step and a dry etching step, followed by deposition of a titanium nitride film (TiN) and a tungsten film (W). Moreover, the surface is planarized by using a CMP process and at the same time, the titanium nitride film (TIN) and the tungsten film (W) outside the via hole are removed to form vias 9, 9b, and 9a. Next, a titanium nitride film (TiN) and an aluminum film (Al) are deposited successively to form a metal wiring layer. The metal wiring layer is patterned by using an exposure step and a dry etching step to form second wirings 6, 6b, and 6a in the second-level wiring layer (Metal 2).

By the above-described steps, the semiconductor device according to the present embodiment is manufactured.

It is to be noted that the semiconductor device of the present embodiment does not require all of the logic portion 60, the FPGA portion 70, and the memory portion 80 and for example, it may have only the logic portion 60 and the memory portion 80.

The present embodiment can produce advantages similar to those of the first and second embodiments. In addition, in the semiconductor device of the present embodiment, the FPGA or memory array using the resistance change element of the invention can be mounted in a logic LSI after a slight change in the step, which contributes to a large reduction in a manufacturing cost. Moreover, the FPGA or memory array using the resistance change element can be mounted without changing the device parameter of a logic LSI.

Thus, the resistance change element of the invention can be used for general-purpose nonvolatile memories or microcontroller-embedded nonvolatile memories. In addition, it can also be employed in new fields such as nonvolatile switches for FPGA and switch/memory-embedded elements because it can be controlled to an On/Off ratio of a memory element.

The invention is not limited to the above embodiments. It is apparent that the embodiments can be modified or changed as needed within the technical concept of the invention.

What is claimed is:

1. A resistance change nonvolatile memory device comprising:
    a first electrode;
    a resistance change portion provided over the first electrode; and
    a second electrode provided over the resistance change portion, wherein the resistance change portion comprises:
a resistance change layer provided over the first electrode and undergoing a change in resistance by an applied voltage; and
a stable layer provided over the resistance change layer and forming a filament, and
wherein the resistance change layer contains a metal oxide different from a metal oxide which the stable layer contains, has an oxide formation energy greater than that of the stable layer, and has such a film thickness as to permit resistance of the resistance change portion in an Off state to fall within a range determined by the film thickness.

2. The resistance change nonvolatile memory device according to claim 1,
wherein the resistance in an Off state is constant regardless of an Off voltage.

3. The resistance change nonvolatile memory device according to claim 2,
wherein the film thickness of the resistance change layer is determined based on a difference in oxide formation energy between the resistance change layer and the stable layer.

4. The resistance change nonvolatile memory device according to claim 3,
wherein the stable layer contains any one of tantalum oxide, silicon oxide, cobalt oxide, and tungsten oxide and the resistance change layer contains any one of titanium oxide, aluminum oxide, zirconium oxide, and hafnium oxide.

5. The resistance change nonvolatile memory device according to claim 4,
wherein the stable layer contains tantalum oxide and the resistance change layer contains titanium oxide, and
wherein the resistance change layer has a film thickness less than 1 nm.

6. The resistance change nonvolatile memory device according to claim 4,
wherein the stable layer contains tantalum oxide and the resistance change layer contains zirconium oxide, and
wherein the resistance change layer has a film thickness less than 2 nm.

7. The resistance change nonvolatile memory device according to claim 1,
wherein the resistance change layer has a film thickness equal to the width of a tunnel barrier formed in the Off state.

8. The resistance change nonvolatile memory device according to claim 1,
wherein the resistance change nonvolatile memory device operates in a region in which the maximum resistance value in the Off state is determined by the film thickness of the resistance change layer.

9. The resistance change nonvolatile memory device according to claim 1,
wherein the resistance change nonvolatile memory device has resistance, in the Off state, of 1 kΩ or greater but not greater than 10 MΩ.

10. A semiconductor device comprising:
a memory portion having a plurality of memory cells, and
a logic portion performing data processing by making use of the memory portion,
wherein the memory cells each have the resistance change nonvolatile memory device as claimed in claim 1.

11. The semiconductor device according to claim 10, further comprising:
an FPGA portion having a switch block,
wherein the switch block has a plurality of switches,
wherein the switches each comprise:
a third electrode;
a second resistance change layer provided over the third electrode and undergoing a change in resistance by an applied voltage;
a second stable layer provided over the second resistance change layer and forming a filament; and
a fourth electrode provided over the second stable layer, and
wherein the second resistance change layer has a film thickness greater than the film thickness of the resistance change layer of each of the memory cells.

12. A method of operating a resistance change nonvolatile memory device,
the device comprising: a first electrode; a resistance change portion provided over the first electrode; and a second electrode provided over the resistance change portion,
the resistance change portion comprising: a resistance change layer provided over the first electrode and undergoing a change in resistance by an applied voltage; and a stable layer provided over the resistance change layer and forming a filament,
the resistance change layer containing a metal oxide different from a metal oxide which the stable layer contains, having an oxide formation energy greater than the oxide formation energy of the stable layer, and having such a thickness as to permit the resistance of the resistance change portion in an Off state to fall within a range determined by the film thickness,
the method comprising the steps of:
applying, in Forming the resistance change portion, a Forming voltage between the first electrode and the second electrode to form a filament in the resistance change layer and the stable layer;
applying, in changing the resistance change portion to an Off state, an Off voltage between the first electrode and the second electrode to remove the filament from the resistance change layer; and
applying, in changing the resistance change portion to an On state, an On voltage between the first electrode and the second electrode to form a filament of the resistance change layer.

* * * * *